US012621983B2

(12) United States Patent
Jeong et al.

(10) Patent No.: US 12,621,983 B2
(45) Date of Patent: May 5, 2026

(54) SEMICONDUCTOR DEVICE INCLUDING VERTICAL CHANNEL REGION

(71) Applicant: Samsung Electronics Co., Ltd., Suwon-si (KR)

(72) Inventors: Moonyoung Jeong, Suwon-si (KR); Kiseok Lee, Suwon-si (KR); Sangho Lee, Suwon-si (KR); Hyungjun Noh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 501 days.

(21) Appl. No.: 18/187,229

(22) Filed: Mar. 21, 2023

(65) Prior Publication Data

US 2023/0320077 A1     Oct. 5, 2023

(30) Foreign Application Priority Data

Mar. 30, 2022    (KR) ........................ 10-2022-0039883

(51) Int. Cl.
*H10B 12/00* (2023.01)
*H01L 23/528* (2006.01)
(52) U.S. Cl.
CPC ......... *H10B 12/36* (2023.02); *H01L 23/5283* (2013.01); *H10B 12/482* (2023.02); *H10B 12/485* (2023.02); *H10B 12/488* (2023.02)
(58) Field of Classification Search
CPC .... H10B 12/36; H10B 12/482; H10B 12/485; H10B 12/488; H10B 12/05; H10B 12/315; H10B 12/34; H10B 12/50; H01L 23/5283; H10D 30/63; H10D 30/025; H10D 30/611; H10D 64/252
See application file for complete search history.

(56) References Cited

U.S. PATENT DOCUMENTS

| | | | |
|---|---|---|---|
| 9,064,730 | B2 | 6/2015 | Ellis et al. |
| 9,425,190 | B2 | 8/2016 | Luthra et al. |
| 2005/0110079 | A1 | 5/2005 | Nowak |
| 2013/0234242 | A1 | 9/2013 | Hwang |

(Continued)

FOREIGN PATENT DOCUMENTS

KR      10-2006-0114991 A      11/2006

OTHER PUBLICATIONS

Extended European Search Report dated Jul. 26, 2023 issued in corresponding European Patent Application No. 23165260.3.

(Continued)

*Primary Examiner* — Mohammed R Alam
(74) *Attorney, Agent, or Firm* — Fish & Richardson P.C.

(57) ABSTRACT

A semiconductor device includes a substrate, a first gate structure and a second gate structure on the substrate, a single back gate structure between the first gate structure and the second gate structure, a first structure including a first vertical channel region extending in a vertical direction, at least a portion of the first vertical channel region between the first gate structure and the single back gate structure, and a second structure including a second vertical channel region extending in the vertical direction. The second structure is spaced apart from the first structure, and at least a portion of the second vertical channel region is between the second gate structure and the single back gate structure.

20 Claims, 31 Drawing Sheets

(56)          References Cited

U.S. PATENT DOCUMENTS

| | | |
|---|---|---|
| 2016/0020326 A1 | 1/2016 | Mazure et al. |
| 2020/0284753 A1 | 9/2020 | Ionescu et al. |
| 2020/0411523 A1* | 12/2020 | Shin ....................... H10B 12/02 |
| 2021/0104526 A1 | 4/2021 | Son |
| 2021/0159228 A1 | 5/2021 | Chang et al. |
| 2021/0351182 A1 | 11/2021 | Yang et al. |

OTHER PUBLICATIONS

Office Action in Korean Appln. No. 10-2022-0039883, mailed on Nov. 5, 2025, 16 pages (with English translation).

* cited by examiner 200,300

SEMICONDUCTOR DEVICE INCLUDING VERTICAL CHANNEL REGION

CROSS-REFERENCE TO RELATED APPLICATION

This application claims benefit of priority to Korean Patent Application No. 10-2022-0039883 filed on Mar. 30, 2022 in the Korean Intellectual Property Office, the disclosure of which is incorporated herein by reference in its entirety.

FIELD

Some example embodiments relate to a semiconductor device including a vertical channel region and/or a method of fabricating the same.

BACKGROUND

Research is being conducted into reducing the size of elements constituting semiconductor devices and to improve performance thereof. For example, in dynamic random-access memory (DRAM) devices, research is being conducted to reliably and stably form elements having a reduced size. However, as sizes of the elements are reduced, it becomes increasingly difficult to implement transistors having a desired degree of performance.

SUMMARY

Some example embodiments provide a semiconductor device having improved performance.

According to an example embodiment, a semiconductor device includes a substrate, a first gate structure and a second gate structure on the substrate, the first gate structure and the second gate structure spaced apart from each other, a single back gate structure between the first gate structure and the second gate structure, the single back gate structure spaced apart from the first gate structure and the second gate structure, a first structure including a first vertical channel region extending in a vertical direction, wherein at least a portion of the first vertical channel region is between the first gate structure and the single back gate structure, and a second structure including a second vertical channel region extending in the vertical direction, the second structure spaced apart from the first structure, wherein at least a portion of the second vertical channel region is between the second gate structure and the single back gate structure.

According to an example embodiment, a semiconductor device includes a substrate, a first structure on the substrate, the first structure including a first horizontal portion and a pair of first vertical portions extending from the first horizontal portion in a vertical direction, wherein the pair of first vertical portions are spaced apart from each other, a second structure on the substrate, the second structure including a second horizontal portion and a pair of second vertical portions extending from the second horizontal portion in the vertical direction, wherein the pair of second vertical portions are spaced apart from each other, a pair of first gate structures on the first horizontal portion between the pair of first vertical portions, the pair of first gate structures extending in a horizontal direction, a pair of second gate structures on the second horizontal portion, between the pair of second vertical portions, the pair of second gate structures extending in the horizontal direction, and a single back gate structure between the first structure and the second structure.

According to an example embodiment, a semiconductor device including a first memory cell array, a second memory cell array spaced apart from the first memory cell array, and a back gate control circuit on at least one side of each of the first and second memory cell arrays, wherein each of the first and second memory cell arrays includes transistors, word lines, bit lines, data storage structures, and back gate lines, the back gate lines intersect the first and second memory cell arrays, and the back gate lines are electrically connected to the back gate control circuit, the bit lines extend in a first direction, the word lines and the back gate lines are parallel to each other and spaced apart from each other, and the word lines and the back gate lines extend in a second direction perpendicular to the first direction, the transistors include a first pair of transistors sharing a single first lower source/drain, and a second pair of transistors sharing a single second lower source/drain, a single first back gate line of the back gate lines is between the first pair of transistors and the second pair of transistors, and each of the first pair of transistors further includes a vertical channel region on the single first lower source/drain and an upper source/drain on the vertical channel region.

BRIEF DESCRIPTION OF DRAWINGS

The above and other aspects, features, and advantages of the inventive concepts will be more clearly understood from the following detailed description, taken in conjunction with the accompanying drawings.

DETAILED DESCRIPTION

Hereinafter, terms such as "upper," "intermediate," and "lower" may be replaced with other terms, for example, "first," "second," and "third" to describe elements of the specification. Terms such as "first," "second," and "third" may be used to describe various elements, but the elements may not be restricted by the terms, and a "first element" may be referred to as a "second element."

Figure 1:
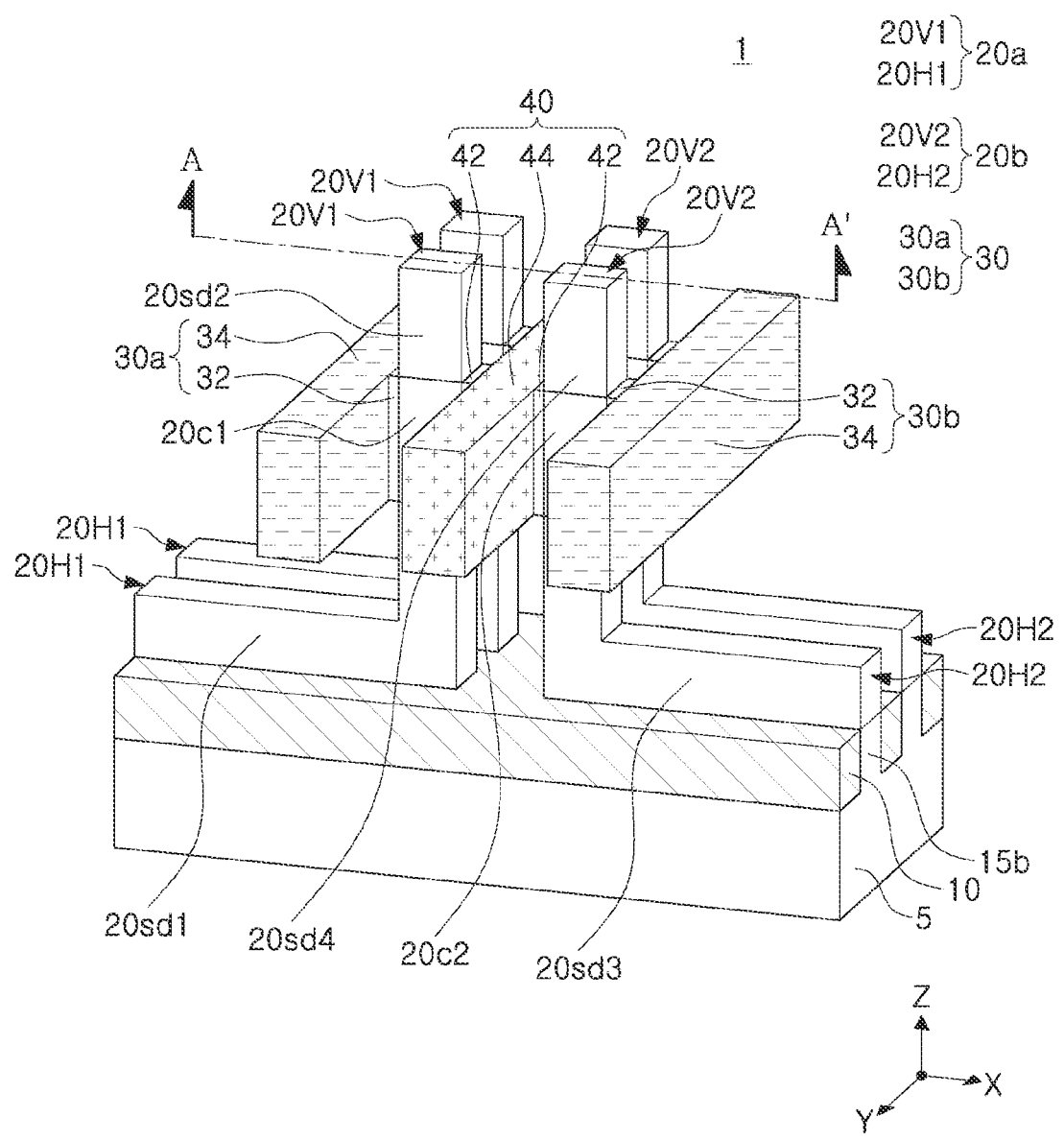
FIGS. 1, 2A, and 2B are conceptual views of a semiconductor device according to an example embodiment.

A semiconductor device according to an example embodiment will be described with reference to FIGS. 1, 2A, and 2B. FIG. 1 is a conceptual perspective view illustrating a semiconductor device according to an example embodiment, FIG. 2A is a plan view of the perspective view of FIG. 1, and FIG. 2B is a conceptual cross-sectional view illustrating a region taken along line A-A' of FIG. 1.

Figure 2A:
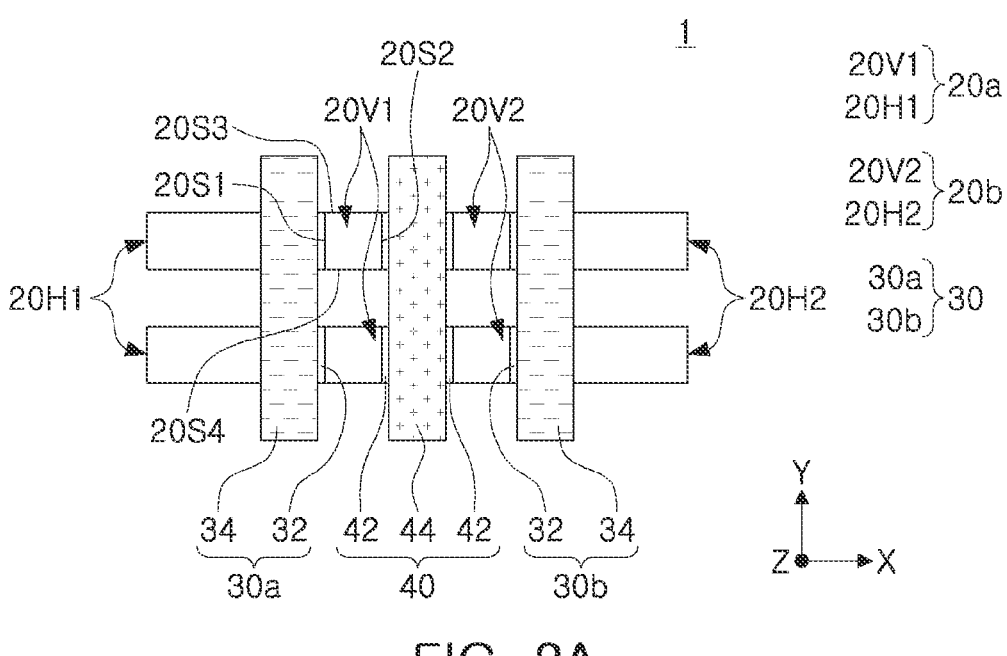
Figure 2B:
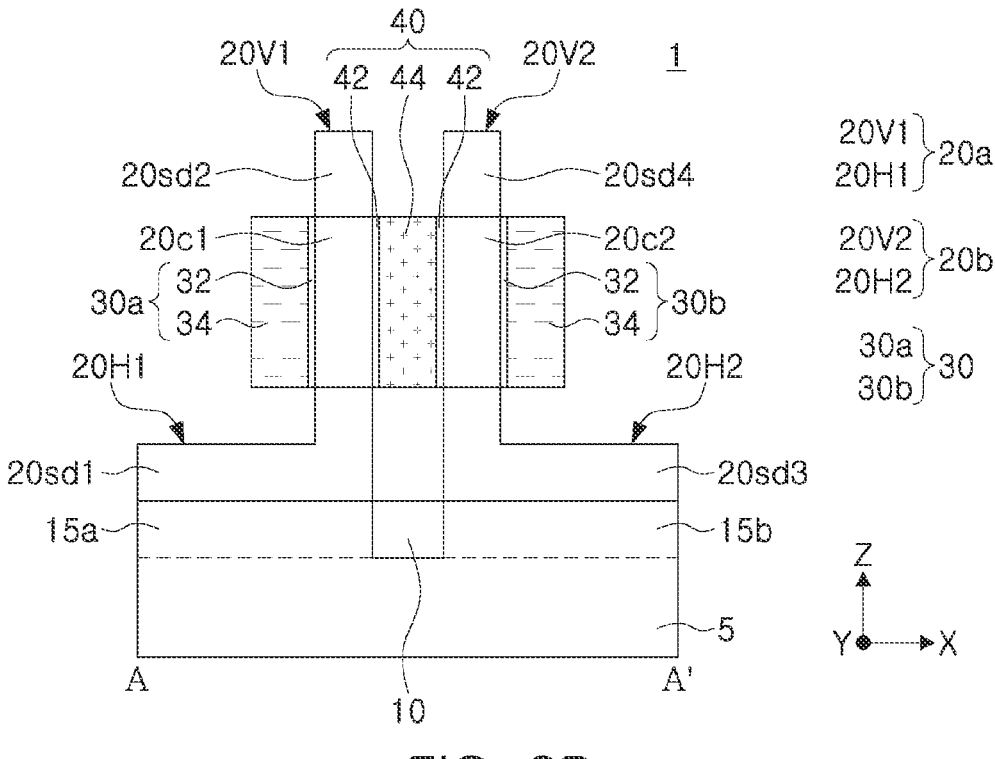

Referring to FIGS. 1, 2A, and 2B, a semiconductor device 1 according to an example embodiment may include a substrate 5, structures 20a and 20b, gate structures 30, and a back gate structure 40.

The substrate 5 may be a semiconductor substrate. For example, the substrate 5 may include a semiconductor material such as a group IV semiconductor, a group III-V compound semiconductor, or a group II-VI compound semiconductor. For example, the group IV semiconductor may include silicon, germanium, or silicon-germanium, but example embodiments are not limited thereto. The substrate 5 may be provided as a bulk semiconductor wafer, a semiconductor substrate including an epitaxial layer, a silicon-on-insulator (SOI) substrate, a semiconductor-on-insulator (SeOI) substrate, or the like.

The semiconductor device 1 may further include an isolation region 10 defining active regions 15a and 15b. The isolation region 10 may be formed of an insulating material. The active regions 15a and 15b may have P-type conductivity. The active regions 15a and 15b may be formed to have a shape protruding from the substrate 5 in a vertical direction Z.

As an example, the substrate 5 may be a single-crystal silicon substrate. The active regions 15a and 15b may extend vertically from the substrate 5, and may be formed of single-crystal silicon.

The structures 20a and 20b may be disposed on the substrate 5. The structures 20a and 20b may be disposed on the active regions 15a and 15b.

The structures 20a and 20b may be spaced apart from each other. The structures 20a and 20b may be repeatedly and regularly arranged in a first direction X and a second direction Y. The first direction X may be parallel or substantially parallel to an upper surface of the substrate 5. The second direction Y may be parallel to the upper surface of the substrate 5 and may intersect the first direction X.

The structures 20a and 20b may be described as a "semiconductor structure," "channel semiconductor structure," "channel structure," or "body structure."

The structures 20a and 20b may include a material which may be used as a channel of a transistor, for example, a semiconductor material. For example, the structures 20a and 20b may be formed of a semiconductor material such as silicon, or the like. The structures 20a and 20b may be formed of single-crystal silicon or polysilicon. However, the material of the structures 20a and 20b is not limited to a semiconductor material such as silicon, and may be another semiconductor material which may be used as a channel region of a transistor. For example, the structures 20a and 20b may include an oxide semiconductor layer or a two-dimensional (2D) material layer which may be used as a channel region of a transistor.

The oxide semiconductor layer may include indium gallium zinc oxide (IGZO), but example embodiments are not limited thereto. For example, the oxide semiconductor layer may include at least one of indium tungsten oxide (IWO), indium tin gallium oxide (ITGO), indium aluminum zinc oxide (IAZO), indium gallium oxide (IGO), indium tin zinc oxide (ITZO), zinc tin oxide (ZTO), indium zinc oxide (IZO), ZnO, indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO)), silicon indium zinc oxide (SiInZnO), zinc tin oxide (ZnSnO), aluminum zinc tin oxide (AlZnSnO), gallium zinc tin oxide (GaZnSnO), zirconium zinc tin oxide (ZrZnSnO), and indium gallium silicon oxide (InGaSiO), but example embodiments are not limited thereto.

The 2D material layer may include at least one of a transition metal dichalcogenide material layer (TMD), a black phosphorous material layer, and a hexagonal boron-nitride material layer (hBN). For example, the 2D material layer may include a material, capable of forming a 2D material, such as at least one of BiOSe, CrI, $WSe_2$, $MoS_2$, TaS, WS, SnSe, ReS, $\beta$-SnTe, MnO, AsS, P(black), InSe, h-BN, GaSe, GaN, SrTiO, MXene, and Janus 2D materials, but example embodiments are not limited thereto.

Each of the structures 20a and 20b may include a single semiconductor layer or a plurality of semiconductor layers. For example, each of the structures 20a and 20b may include at least one of a silicon semiconductor layer, an oxide semiconductor layer, and a two-dimensional material layer.

The structures 20a and 20b may include a first structure 20a and a second structure 20b adjacent to each other in any one direction, for example, the first direction X.

Each of the structures 20a and 20b may include a horizontal portion and at least one vertical portion extending from at least a portion of the horizontal portion in the vertical direction Z. Each of the structures 20a and 20b may include one vertical portion extending upwardly from at least one side of the horizontal portion in a length direction, but example embodiments are not limited thereto. For example, each of the structures 20a and 20b may include a pair of vertical portions extending upwardly from opposite sides of the horizontal portion in the length direction.

Hereinafter, a single vertical portion extending upward from at least one side of the horizontal portion in the length direction will mainly be described. However, example embodiments are not limited thereto, and may include a pair of vertical portions extending upwardly from opposite sides of the horizontal portion in the length direction. For example, the first structure 20a may include a first horizontal portion 20H1 and a first vertical portion 20V1 extending upwardly from one side of the first horizontal portion 20H1 in the length direction. The first structure 20a may further include another first vertical portion having the same or substantially the same structure and shape as the first vertical portion 20V1 and extending upwardly from the other side of the first horizontal portion 20H1 in the length direction. Similarly, the second structure 20b may include a second horizontal portion 20H2 and a second vertical portion 20V2 extending upwardly from a portion of the second horizontal portion 20H2. The first vertical portion 20V1 and the second vertical portion 20V2 may be adjacent to each other in the first direction X.

Each of the structures 20a and 20b may include a vertical channel region extending in the vertical direction Z, perpendicular or substantially perpendicular to an upper surface of the substrate 5. For example, the first structure 20a may include a first vertical channel region 20c1 extending in the vertical direction Z, and the second structure 20b may include a second vertical channel region 20c2 extending in the vertical direction Z.

Each of the structures 20a and 20b may further include sources/drains. The sources/drains may have N-type conductivity. For example, the first structure 20a may further include a first source/drain 20sd1 and a second source/drain 20sd2 spaced apart from each other, and the second structure 20b may further include a third source/drain 20sd3 and a fourth source/drain 20sd4 spaced apart from each other. The first source/drain 20sd1 may be disposed below the first vertical channel region 20c1, and the second source/drain 20sd2 may be disposed above the first vertical channel region 20c1. The third source/drain 20sd3 may be disposed below the second vertical channel region 20c2, and the fourth source/drain 20sd4 may be disposed above the second vertical channel region 20c2.

The first source/drain 20sd1 may be disposed in the first horizontal portion 20H1 and may extend inwardly of a lower region of the first vertical portion 20V1. The second source/drain 20sd2 may be disposed in an upper region of the first vertical portion 20V1. The first vertical channel region 20c1 may be disposed between the first source/drain 20sd1 and the second source/drain 20sd2 in the first vertical portion 20V1. The third source/drain 20sd3 may be disposed in the second horizontal portion 20H2 and may extend inwardly of a lower region of the second vertical portion 20V2. The fourth source/drain 20sd4 may be disposed in an upper region of the second vertical portion 20V2. The second vertical channel region 20c2 may be disposed between the third source/drain 20sd3 and the fourth source/drain 20sd4 in the second vertical portion 20V2.

The gate structures 30 may include a first gate structure 30a and a second gate structure 30b spaced apart from each other.

The gate structures 30 may intersect the horizontal portions 20H1 and 20H2 of the structures 20a and 20b. For example, the gate structures 30 may extend across the horizontal portions 20H1 and 20H2 of the structures 20a and 20b. For example, in a plan view, the first gate structure 30a may extend across the first horizontal portion 20H1, and the second gate structure 30b may extend across the second horizontal portion 20H2.

Each of the gate structures 30 may include a gate dielectric layer 32 and a gate electrode 34 on the gate dielectric layer 32. For example, the first gate structure 30a may include a first gate dielectric layer 32 and a first gate electrode 34, and the second gate structure 30b may include a second gate dielectric layer (32) and a second gate electrode 34.

The gate dielectric layer 32 may include at least one of a low-k dielectric material, a silicon oxide, and a high-k dielectric material. The low-k dielectric material may be a dielectric material having a dielectric constant lower a dielectric constant of the silicon oxide, and the high-k dielectric material may be a dielectric material having a dielectric constant higher than the dielectric constant of the silicon oxide. The high-k dielectric material may include a metal oxide or a metal oxynitride. For example, the high-k dielectric material may include $HfO_2$, HfSiO, HfSiON, HMO, HfSiO, HfZrO, $ZrO_2$, $Al_2O_3$, or combinations thereof, but example embodiments are not limited thereto. The gate dielectric layer 32 may include a single layer or multiple layers of the above-mentioned materials.

The gate electrode 34 may include doped polysilicon, a metal, a conductive metal nitride, a metal-semiconductor compound, a conductive metal oxide, graphene, carbon nanotubes, or combinations thereof, but example embodiments are not limited thereto. For example, the gate electrode 34 may be formed of doped polysilicon, Al, Cu, Ti, Ta, Ru, W, Mo, Pt, Ni, Co, TiN, TaN, WN, NbN, TiAl, TiAlN, TiAlC, TaAlC, TiSi, TiSiN, TaSi, TaSiN, RuTiN, NiSi, CoSi, IrOx, RuOx, graphene, carbon nanotubes, or combinations thereof, but example embodiments are not limited thereto. The gate electrode 34 may include a single layer or multiple layers of the above-mentioned materials.

The first gate dielectric layer 32 of the first gate structure 30a may be disposed between the first gate electrode 34 of the first gate structure 30a and the first vertical portion 20V1. For example, the first gate dielectric layer 32 of the first gate structure 30a may be disposed between the first gate electrode 34 of the first gate structure 30a and the first vertical channel regions 20c1 of the first vertical portion 20V1. The first gate dielectric layer 32 of the first gate structure 30a may be in contact with the first gate electrode 34 of the first gate structure 30a and a portion of a side surface of the first vertical channel region 20c1 of the first vertical portion 20V1.

The second gate dielectric layer 32 of the second gate structure 30b may be disposed between the second gate electrode 34 of the second gate structure 30b and the second vertical portion 20V2. For example, the second gate dielectric layer 32 of the second gate structure 30b may be formed between the second gate electrode 34 of the second gate structure 30b and the second vertical channel region 20c2 of the second vertical portion 20V2. The second gate dielectric layer 32 of the second gate structure 30b may be in contact with the second gate electrode 34 of the second gate structure 30b and a portion of a side surface of the second vertical channel region 20c2 of the second vertical portion 20V2.

The back gate structure 40 may be disposed between the first gate structure and the second gate structure 30a and 30b. The back gate structure 40 may extend while passing through a space between the first and second vertical portions 20V1 and 20V2, between the first gate structure and the second gate structure 30a and 30b. A single back gate structure 40 may be disposed between the first and second vertical portions 20V1 and 20V2. For example, a single back gate structure 40 may be disposed between the first gate structure and the second gate structure 30a and 30b adjacent to each other.

The back gate structure 40 may include a back gate electrode 44 and a back gate dielectric layer 42. The back gate dielectric layer 42 includes a first portion (e.g., 42 disposed on a left side of FIGS. 2A and 2B) disposed between the back gate electrode 44 and the first vertical portion 20V1 and a second portion (e.g., 42 disposed on a right side of FIGS. 2A and 2B) disposed between the back gate electrode 44 and the second vertical portion 20V2.

The back gate dielectric layer 42 may include at least one of a low-k dielectric material, a silicon oxide, and a high-k dielectric material. The high-k dielectric may include a metal oxide or a metal oxynitride. For example, the high-k dielectric material may include $HfO_2$, HfSiO, HfSiON, HMO, HfSiO, HfZrO, $ZrO_2$, $Al_2O_3$, or combinations thereof, but example embodiments are not limited thereto. The back gate dielectric layer 42 may include a single layer or multiple layers of the above-mentioned materials.

In one example embodiment, the back gate dielectric layer 42 may be formed of the same or substantially the same material as the gate dielectric layer 32.

In another example embodiment, at least a portion of the back gate dielectric layer 42 may be formed of a material, different from that of the gate dielectric layer 32.

In one example embodiment, the back gate dielectric layer 42 may be formed to have substantially the same thickness as the gate dielectric layer 32.

In another example embodiment, the back gate dielectric layer 42 may be formed to have a thickness, different from that of the gate dielectric layer 32.

The back gate electrode 44 may include doped polysilicon, a metal, a conductive metal nitride, a metal-semiconductor compound, a conductive metal oxide, graphene, carbon nanotubes, or combinations thereof, but example embodiments are not limited thereto. For example, the back gate electrode 44 is formed of doped polysilicon, Al, Cu, Ti, Ta, Ru, W, Mo, Pt, Ni, Co, TiN, TaN, WN, NbN, TiAl, TiAlN, TiAlC, TaAlC, TiSi, TiSiN, TaSi, TaSiN, RuTiN, NiSi, CoSi, IrOx, RuOx, graphene, carbon nanotubes, or combinations thereof, but example embodiments are not limited thereto. The back gate electrode 44 may include a single layer or multiple layers of the above-mentioned materials.

In one example embodiment, the back gate electrode 44 may be formed of the same or substantially the same material as the gate electrode 34.

In another example embodiment, at least a portion of the back gate electrode 44 may be formed of a material, different from that of the gate electrode 34.

In another example embodiment, the back gate electrode 44 may have a work function, different from that of the gate electrode 34. For example, the gate electrode 34 may be formed of a conductive material having a first work function, and the back gate electrode 44 may be formed of a conductive material having a work function, different from the first work function. For example, the gate electrode 34 may include an NMOS work function metal layer, and the back gate electrode 44 may include a PMOS work function metal layer. In another example embodiment, the gate electrode 34 may include a first NMOS work function metal layer, and the back gate electrode 44 may include a second NMOS work function metal layer having a work function, different from that of the first NMOS work function metal layer. The "NMOS work function metal layer" may be defined as a metal layer, capable of adjusting or controlling a threshold voltage of an NMOS transistor, and the "PMOS work function metal layer" may be defined as a metal layer, capable of adjusting or controlling a threshold voltage of a PMOS transistor.

In an example embodiment, the back gate electrode 44 may be formed to have substantially the same thickness as the gate electrode 34.

In another example embodiment, the back gate electrode 44 may be formed to have a thickness, different from that of the gate electrode 34.

The back gate structure 40 may be in contact with the first and second vertical portions 20V1 and 20V2. For example, in the back gate dielectric layer 42 of the back gate structure 40, the first portion (e.g., 42 disposed on the left side in FIGS. 2A and 2B) may be in contact with a portion of a side surface of the first vertical channel region 20c1 of the first vertical portion 20V1, and the second portion (e.g., 42 disposed on the right side of FIGS. 2A and 2B) may be in contact with a portion of a side surface of the second vertical channel region 20c2 of the second vertical portion 20V2.

The gate structures 30 may vertically overlap the horizontal portions 20H1 and 20H2 of the structures 20a and 20b, and the back gate structure 40 may not vertically overlap the structures 20a and 20b. The gate structures 30 may vertically overlap the first and third source/drains 20sd1 and 20sd3, disposed in the horizontal portions 20H1 and 20H2, and the back gate structure 40 may not vertically overlap the first and third sources/drains 20sd1 and 20sd3 disposed in the horizontal portions 20H1 and 20H2.

Each of the first and second vertical portions 20V1 and 20V2 may have first and second side surfaces 20S1 and 20S2, opposing each other in the first direction X, and third and fourth side surfaces 20S3 and 20S4 opposing each other in a second direction Y. In each of the first and second vertical portions 20V1 and 20V2, a side surface contacting the gate structures 30 may be referred to as a first side surface 20S1 to be described, and a side surface contacting the back gate structure 40 may be referred to as a second side surface 20S2 to be described. Alternatively, the first vertical portion 20V1 may be described as including the first to fourth side surfaces 20S1, 20S2, 20S3, and 20S4, and the second vertical portion 20V2 may be described as including fifth to eighth side surfaces, respectively corresponding to the first to fourth side surfaces 20S1, 20S2, 20S3, and 20S4. For example, the first side surface 20S1 of the first vertical portion 20V1 may be in contact with the first gate structure 30*a*, the second side surface 20S2 of the first vertical portion 20V1 may be in contact with the back gate structure 40, the fifth side surface of the second vertical portion 20V2 may be in contact with the second gate structure 30*b*, and the sixth side surface of the second vertical portion 20V2 may be in contact with the back gate structure 40.

The first and second sources/drains 20*sd*1 and 20*sd*2, the first vertical channel region 20*c*1, and the first gate structure 30*a* may constitute a first transistor, and the third and fourth sources/drains 20*sd*3 and 20*sd*4, the second vertical channel region 20*c*2, and the second gate structure 30*b* may constitute a second transistor.

The back gate structure 40 may adjust or control threshold voltages of the first and second transistors.

The back gate electrode 44 and the gate electrodes 34 may be spaced apart from each other to be electrically separated from each other. The back gate electrode 44 may be electrically insulated or isolated from the gate electrodes 34.

In FIGS. 1 and 2A, the gate electrodes 34 and the back gate electrode 44 are illustrated as extending in the second direction Y and a length direction of each of the horizontal portions 20H1 and 20H2 is illustrated as being the first direction X, but example embodiments are not limited thereto. For example, the length direction of each of the horizontal parts 20H1 and 20H2 may be perpendicular or substantially perpendicular to the second direction Y. However, example embodiments are not limited thereto, and the length direction of each of the horizontal parts 20H1 and 20H2 may be an inclined direction without being perpendicular to the second direction Y. Accordingly, in the following various embodiments, although the length direction of each of the horizontal parts 20H1 and 20H2 is illustrated as being perpendicular to the second direction Y, the length direction of each of the horizontal parts 20H1 and 20H2 may be described as being an inclined direction without being perpendicular to the second direction Y.

In some example embodiments, the semiconductor device 1 may include the first gate structure 30*a* and the second gate structure 30*b* spaced apart from each other on the substrate 5; the single back gate structure 40 disposed between the first gate structure 30*a* and the second gate structure 30*b* and spaced apart from the first gate structure and the second gate structure 30*a* and 30*b*, the first structure 20*a* including the first vertical channel region 20*c*1 extending in the vertical direction Z, and the second structure 20*b* including the second vertical channel region 20*c*2 extending in the vertical direction Z and spaced apart from the first structure 20*a*. At least a portion of the first vertical channel region 20*c*1 may be disposed between the first gate structure 20*a* and the back gate structure 40, and at least a portion of the second vertical channel region 20*c*2 may be disposed between the second gate structure 30*b* and the back gate structure 40. The first gate structure 30*a* may include a first gate electrode 34 and at least a first gate dielectric layer 32 interposed between the first gate electrode 34 and the first structure 20*a*, the second gate structure 30*b* may include a second gate electrode 34 and at least a second gate dielectric layer 32 interposed between the second gate electrode 34 and the second structure 20*b*, and the back gate structure 40 may include the back gate electrode 44 and a back gate dielectric layer 42 covering side surfaces of the back gate electrode 44.

When the semiconductor device 1 is a memory device, the gate electrodes 34 may be word lines and the back gate electrode 44 may be a back gate electrode. When the semiconductor device 1 is a memory device, the semiconductor device 1 may be a DRAM, and the first and second transistors may be cell transistors of memory cells of the DRAM. Accordingly, the gate structures 30 may be referred to as cell gate structures to be described, the gate electrode 34 may be referred to as a cell gate electrode to be described, and the gate dielectric layer 32 may be referred to as a cell gate dielectric layer to be described.

The semiconductor device 1 may be a DRAM, but example embodiments are not limited thereto. For example, the semiconductor device 1 may be a memory device, different from a DRAM such as an MRAM or an FeRAM.

The back gate structure 40 may control charges accumulated in the first and second vertical channel regions 20*c*1 and 20*c*2 during operations of the first and second transistors. Accordingly, the back gate structure 40 may suppress or prevent a floating body effect. For example, the first and second vertical channel regions 20*c*1 and 20*c*2 may be disposed between sources/drains spaced apart from each other in the vertical direction Z, and thus, may be a floating body. Accordingly, the back gate structure 40 may prevent and significantly reduce a phenomenon in which charges, for example, holes are accumulated in the floating body of the first and second vertical channel regions 20*c*1 and 20*c*2 during the operation of the first and second transistors to change the threshold voltages of the first and second transistors. As a result, the back gate structure 40 may allow the first and second transistors to stably operate.

A single back gate structure 40 may be disposed between the first gate structure and the second gate structure 30*a* and 30*b* adjacent to each other to reduce an overall plan area of the semiconductor device 1 and to improve the degree of integration. Accordingly, the back gate structure 40 may improve electrical performance of the semiconductor device 1 and may increase the degree of integration of the semiconductor device 1.

Hereinafter, various modified example embodiments of the elements of the above-described semiconductor device 1 will be described. The various modified examples of the elements of the above-described semiconductor device 1 will be mainly described with respect to modified or substituted elements. In addition, the modified or substituted elements will be described with reference to drawing thereof, respectively. However, the modified or substituted elements may be combined with each other or combined with the above-described elements to configure the semiconductor device 1 according to the example embodiments.

Various modified example embodiments of the semiconductor device 1 will be described with reference to FIG. 3A, FIG. 3B, FIG. 3C, FIG. 3D, FIG. 4A, FIG. 4B, FIG. 4C, FIG. 4D, FIG. 5A, FIG. 5B, FIG. 5C, FIG. 5D, FIG. 6A, FIG. 6B, FIG. 7A, FIG. 7B, and FIGS. 8A and 8B, respectively. Among FIGS. 3A to 8B, FIGS. 3A to 3D and FIGS. 4A to 4D are plan views corresponding to the plan view of FIG. 2A, and are views illustrating elements which may be modified from the plan view of FIG. 2A.

Figure 3A:
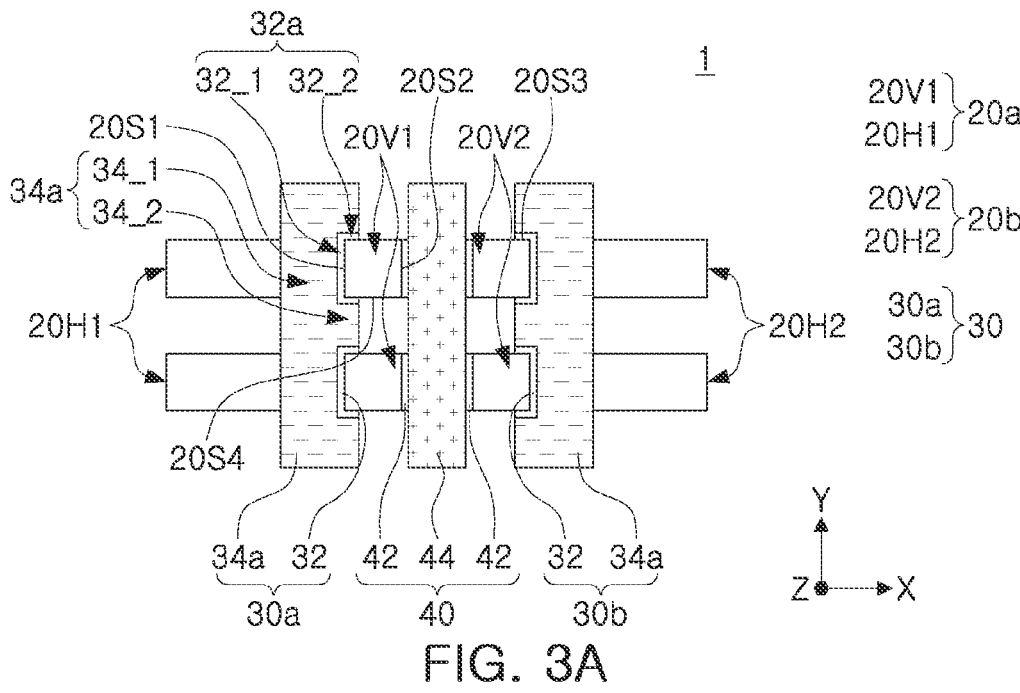
FIG. 3A is a conceptual plan view illustrating a modified example of a semiconductor device according to an example embodiment.

In a modified example, referring to FIG. 3A, in each of the first gate structure and the second gate structure 30*a* and 30*b*, the above-described gate dielectric layer (e.g., 32 of FIG. 2A) and the above-described gate electrode (e.g., 34 of FIG. 2A) may be modified as a gate dielectric layer 32a and a gate electrode 34a in FIG. 3A, respectively.

The gate electrode 34a may extend to cover at least a portion of each of the third and fourth side surfaces 20S3 and 20S4 while covering the first side surface 20S1 of each of the first and second vertical portions 20V1 and 20V2. Accordingly, the gate electrode 34a includes a first electrode portion 34_1, covering the first side surface 20S1 of each of the first and second vertical portions 20V1 and 20V2, and a second electrode portion 34_2 covering at least a portion of each of the third and fourth surfaces 20S3 and 20S4. The gate dielectric layer 32a may include a first dielectric portion 32_1, contacting the first side surface 20S1 of each of the first and second vertical portions 20V1 and 20V2, and a second dielectric portion 32_2 contacting at least a portion of each of the third and fourth side surfaces 20S3 and 20S4. The first electrode portion 34_1 may face the first vertical channel region 20c1 of the first vertical portion 20V1 in the first direction X. The second electrode portion 34_2 may not face the first vertical channel region 20c1 of the first vertical portion 20V1 in the first direction X. A distance between the first electrode portion 34_1 and the back gate electrode 44 in the first direction X may be greater than a distance between the second electrode portion 34_2 and the back gate electrode 44 in the first direction X.

The first to fourth side surfaces 20S1, 20S2, 20S3, and 20S4 may be respectively described as side surfaces of the first and second vertical channel regions 20c1 and 20c2 of FIGS. 1 and 2B.

In an example embodiment, the second electrode portion 34_2 may cover half of each of the third and fourth side surfaces 20S3 and 20S4, or may cover a portion smaller than half of each of the third and fourth side surfaces 20S3 and 20S4. For example, the second electrode portion 34_2 may cover half, or less than half, of the third side surface 20S3, and may cover half, or less than half, of the fourth side surface 20S4.

Accordingly, the first gate structure 30a may cover three surfaces of the first vertical portion 20V1, for example, the first surface 20S1, the third surface 20S3, and the fourth surface 20S4, and the second gate structure 30b may cover three surfaces of the second vertical portion 20V2, for example, the first surface 20S1, the third surface 20S3, and the fourth surface 20S4. Accordingly, the first gate structure and the second gate structure 30a and 30b may be a tri-gate structure which may improve gate controllability.

Accordingly, transistors including the first gate structure and the second gate structure 30a and 30b and the first and second vertical channel regions (e.g., 20c1 and 20c2 of FIGS. 1 and 2B) may be FinFETs having a vertical channel structure in which a channel between a source and a drain is formed in a vertical direction. Accordingly, the semiconductor device 1 may include transistors, which may be FinFETs having a tri-gate structure and a vertical channel structure, and may include the back gate structure 40, resulting in improved performance thereof.

Figure 3B:
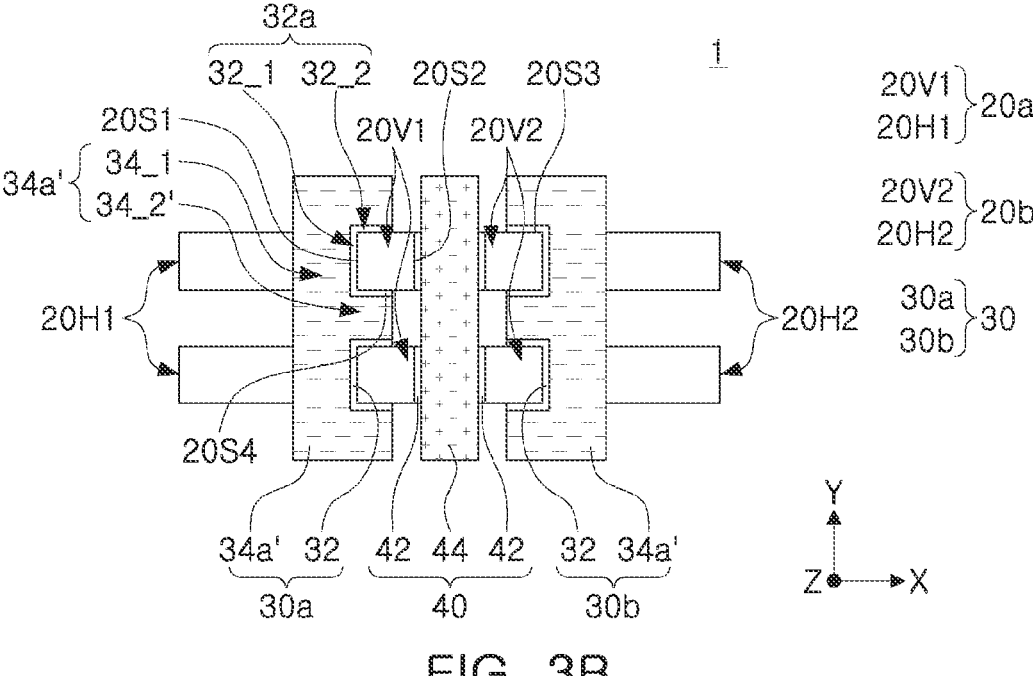
FIG. 3B is a conceptual plan view illustrating a modified example of a semiconductor device according to an example embodiment.

In a modified example embodiment, referring to FIG. 3B, in each of the first gate structure and the second gate structure 30a and 30b, the second electrode portion 34_2 described in FIG. 3A may be modified as a second electrode portion 34_2' in FIG. 3B. The second electrode portion 34_2' of the gate electrode 34a' may cover a portion greater than half of each of the third and fourth side surfaces 20S3 and 20S4. For example, the second electrode portion 34_2' may cover a portion greater than a half of the third side surface 20S3 and may cover a portion greater than half of the fourth side surface 20S4. Accordingly, the second electrode portion 34_2' may further improve gate controllability of the first gate structure and the second gate structure 30a and 30b.

Figure 3C:
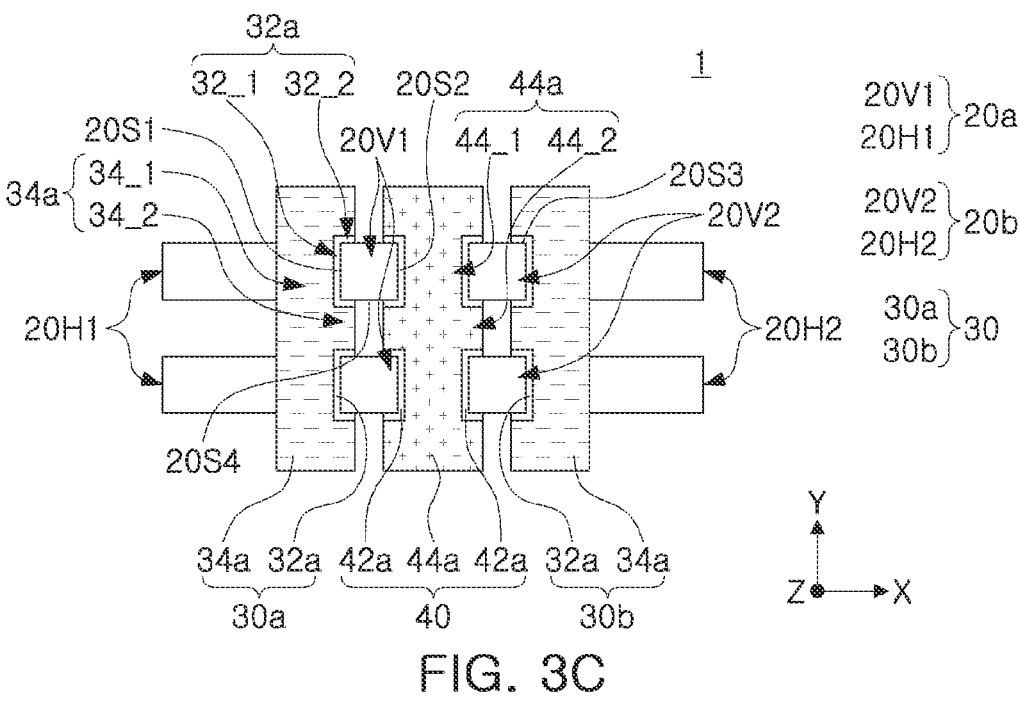
FIG. 3C is a conceptual plan view illustrating a modified example of a semiconductor device according to an example embodiment.

In a modified example, referring to FIG. 3C, in the back gate structure 40, the above-described back gate dielectric layer (e.g., 42 of FIG. 2A) and the above-described gate electrode (e.g., 44 of FIG. 2A) may be modified as the back gate dielectric layer 42a and the back gate electrode 44a in FIG. 3C.

The back gate electrode 44a may extend to cover a portion of each of the third and fourth side surfaces 20S3 and 20S4 while covering the second side surface 20S2 of each of the first and second vertical portions 20V1 and 20V2. Accordingly, the back gate electrode 44a may include a portion, covering the second side surface 20S2 of each of the first and second vertical portions 20V1 and 20V2, and a portion covering a portion of each of the third and fourth side surfaces 20S3 and 20S4. The gate dielectric layer 42a may be disposed between the back gate electrode 44a and the first vertical portion 20V1 and between the back gate electrode 44a and the second vertical portion 20V2. In some example embodiments, the back gate electrode 44a may include a first back gate electrode portion 44_1 and a second back gate electrode portion 44_2.

The back gate electrode 44a may cover three side surfaces of each of the first and second vertical portions 20V1 and 20V2, for example, the first and second vertical channel regions (e.g., 20c1 and 20c2 of FIGS. 1 and 2B). Accordingly, the controllability of the back gate electrode 44a for the first and second vertical channel regions (e.g., 20c1 and 20c2 of FIGS. 1 and 2B) may be improved, so that a floating body effect may be more effectively suppressed or prevented and threshold voltages of transistors may be more effectively inhibited or prevented from fluctuating.

In one example embodiment, an area (or a size) of covering the third and fourth side surfaces 20S3 and 20S4 with the gate electrode 34a in FIGS. 3A and 3B may be different from an area (or a size) of covering the third and fourth side surfaces 20S3 and 20S4 with the back gate electrode 44a in FIG. 3C. For example, the area (or the size) of covering the third and fourth side surfaces 20S3 and 20S4 with the gate electrode 34a may be greater than the area (or the size) of covering the third and fourth side surfaces 20S3 and 20S4 with the back gate electrode 44a in FIG. 3C.

In another example embodiment, when the gate electrode 34a in FIG. 3A covers an area smaller than half of each of the third and fourth side surfaces 20S3 and 20S4, an area (a size) of covering the third and fourth side surfaces 20S3 and 20S4 with the gate electrode 34a may be substantially the same as an area (or a size) of covering the third and fourth side surfaces 20S3 and 20S4 with the back gate electrode 44a in FIG. 3C.

Figure 3D:
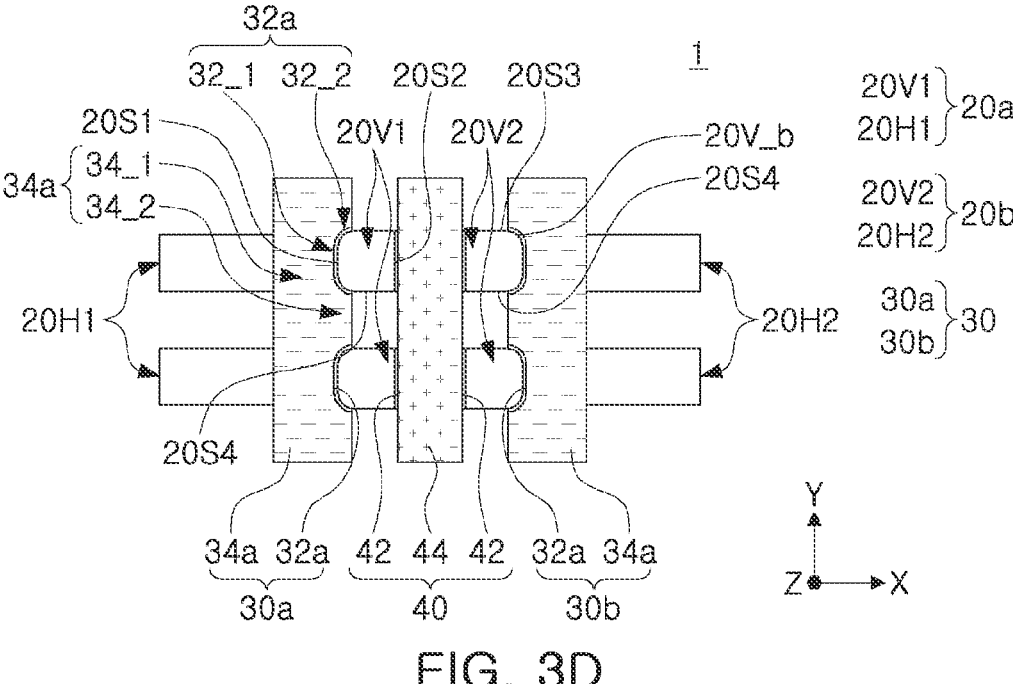
FIG. 3D is a conceptual plan view illustrating a modified example of a semiconductor device according to an example embodiment.

In a modified example embodiment, referring to FIG. 3D, each of the first and second vertical portions 20V1 and 20V2 may include the first to fourth side surfaces 20S1, 20S2, 20S3, and 20S4, as described above. A corner 20V_b between the first side surface 20S1 and the fourth side surface 20S4 and a corner 20V_b between the first side surface 20S1 and the third side surface 20S3 may be covered with the first gate structure and the second gate structure 30a and 30b and may be rounded. For example, the corner 20V_b between each of the third and fourth side surfaces 20S3 and 20S4 and the first side surface 20S1 may be curved. The first and second vertical portions 20V1 and 20V2 may include the curved corners 20V_b, so that degradation of performance of transistors caused by concentration of an electric field may be suppressed or prevented.

Figure 4A:
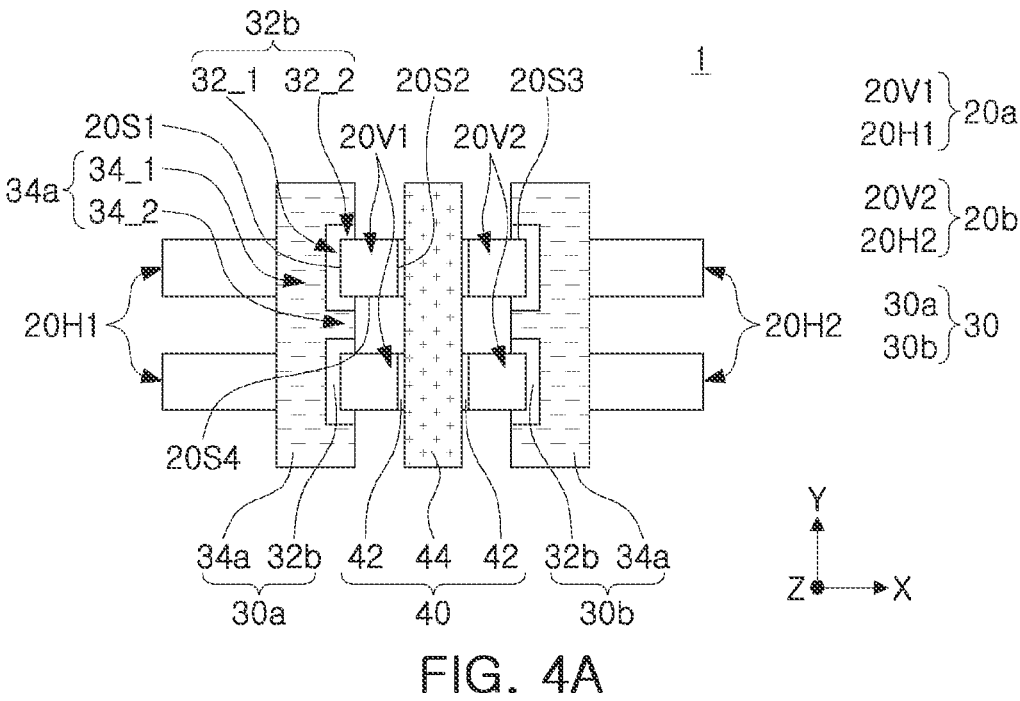
FIG. 4A is a conceptual plan view illustrating a modified example of a semiconductor device according to an example embodiment.

In a modified example embodiment, referring to FIG. 4A, in the gate structures 30 and the back gate structure 40, the above-described gate dielectric layers (e.g., 32 of FIGS. 1 to 2B and 32a of FIGS. 3A to 3D) may be modified as a gate dielectric layer 32b having a thickness, greater than a thickness of the back gate dielectric layer 42.

Figure 4B:
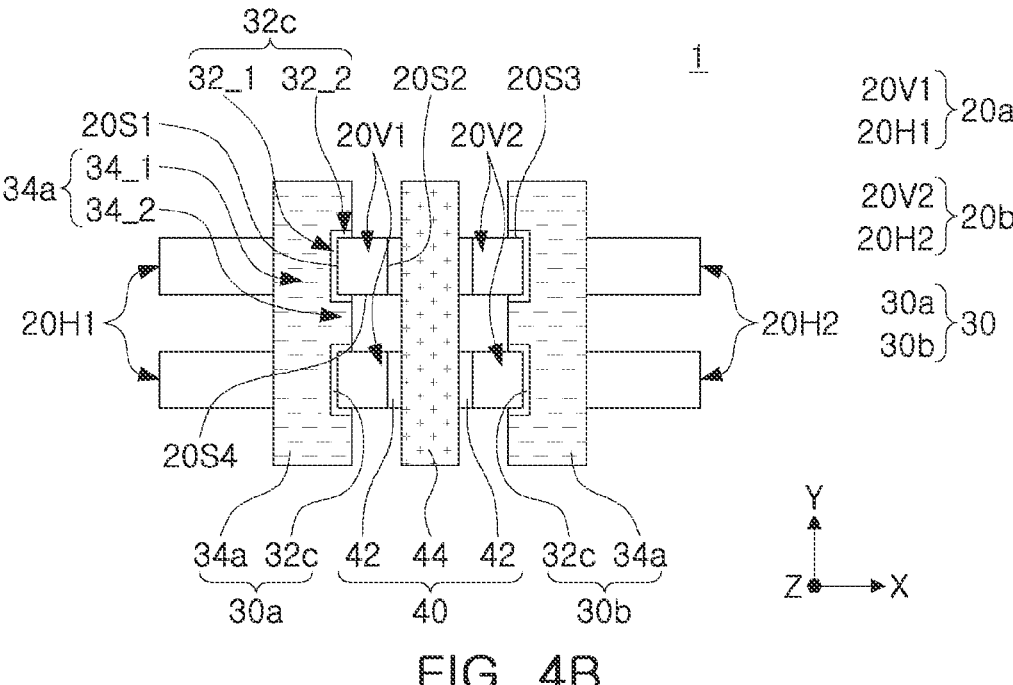
FIG. 4B is a conceptual plan view illustrating a modified example of a semiconductor device according to an example embodiment.

In a modified example embodiment, referring to FIG. 4B, in the gate structures 30 and the back gate structure 40, the above-described gate dielectric layers (e.g., 32 of FIGS. 1 to 2B and 32a of FIGS. 3A to 3D) may be modified as a gate dielectric layer 32c having a thickness, smaller than a thickness of the back gate dielectric layer 42.

Figure 4C:
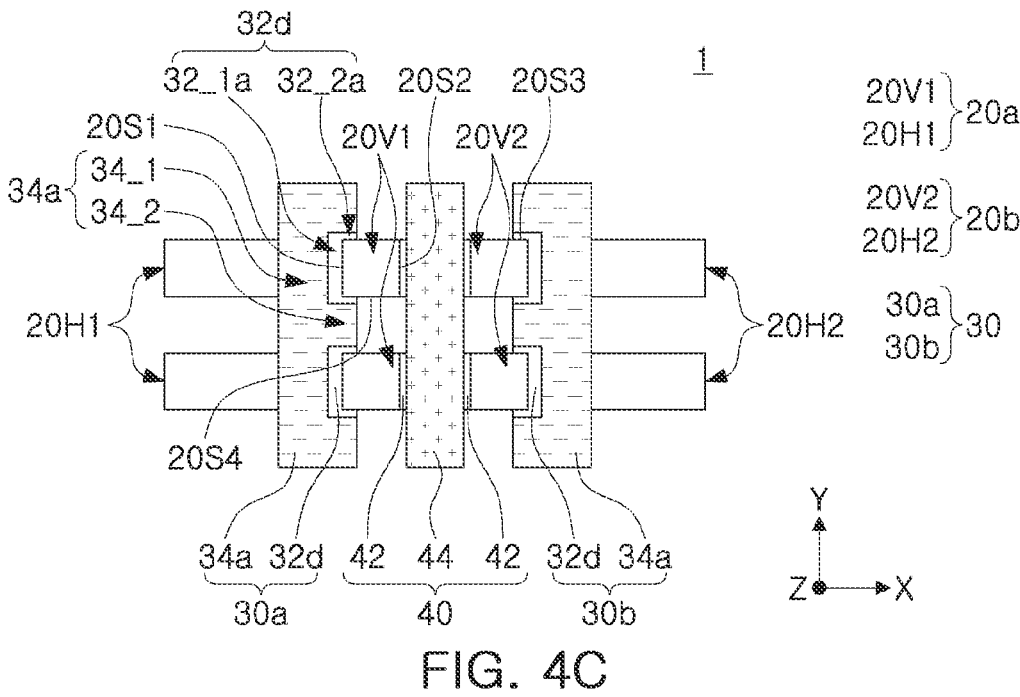
FIG. 4C is a conceptual plan view illustrating a modified example of a semiconductor device according to an example embodiment.

In a modified example embodiment, referring to FIG. 4C, in each of the gate structures 30, the gate dielectric layers 32a, 32b, and 32c of FIGS. 3A to 3D and 4A to 4C, which may have a substantially uniform thickness, may be modified as a gate dielectric layer 32d having a non-uniform thickness. For example, the first dielectric portion 32_1 and the second dielectric portion 32_2 in the gate dielectric layers 32a, 32b, and 32c of FIGS. 3A to 3D and 4A to 4C may have substantially the same thickness, and the gate dielectric layer 32d of FIG. 4C may include a first dielectric portion 32_1a and a second dielectric portion 32_2a having different thicknesses. The first dielectric portion 32_1a may be in contact with the first side surface 20S1, and the second dielectric portion 32_2a may be in contact with at least a portion of each of the third and fourth side surfaces 20S3 and 20S4. In the gate dielectric layer 32d, the first dielectric portion 32_1a may have a thickness, greater than a thickness of the second dielectric portion 32_2a.

Figure 4D:
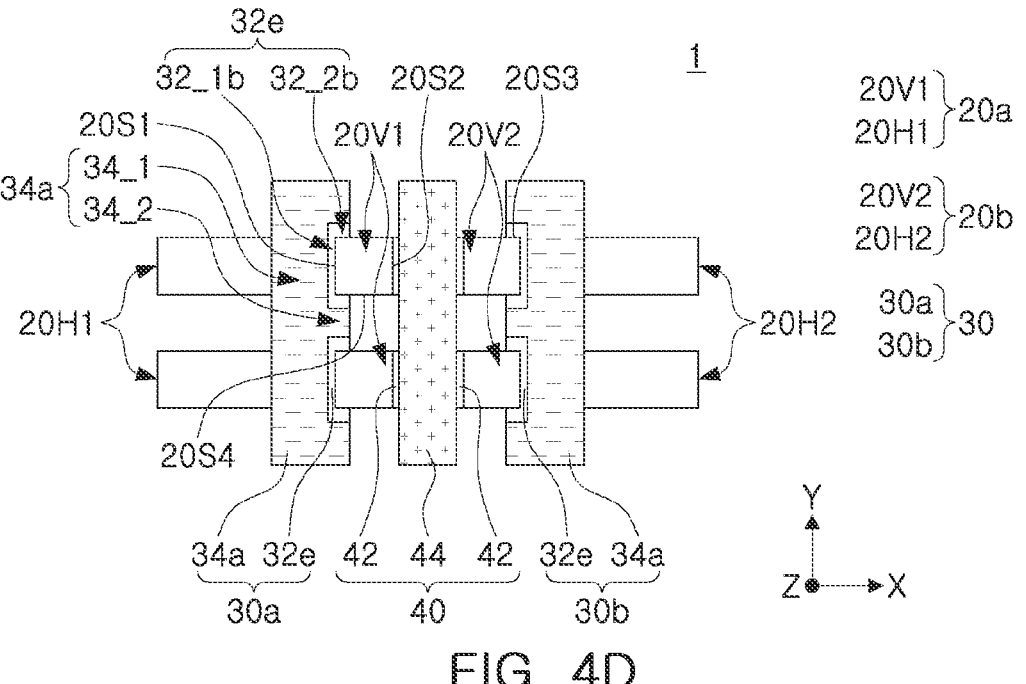
FIG. 4D is a conceptual plan view illustrating a modified example of a semiconductor device according to an example embodiment.

In a modified example embodiment, referring to FIG. 4D, the gate dielectric layer 32d described in FIG. 4C may be modified as the gate dielectric layer 32e as illustrated in FIG. 4D. The gate dielectric layer 32e may include a first dielectric portion 32_1b, contacting the first side surface 20S1, and a second dielectric portion 32_2b contacting at least a portion of each of the third and fourth side surfaces 20S3 and 20S4 and having a thickness, greater than that of the first dielectric portion 32_1b.

Figure 5A:
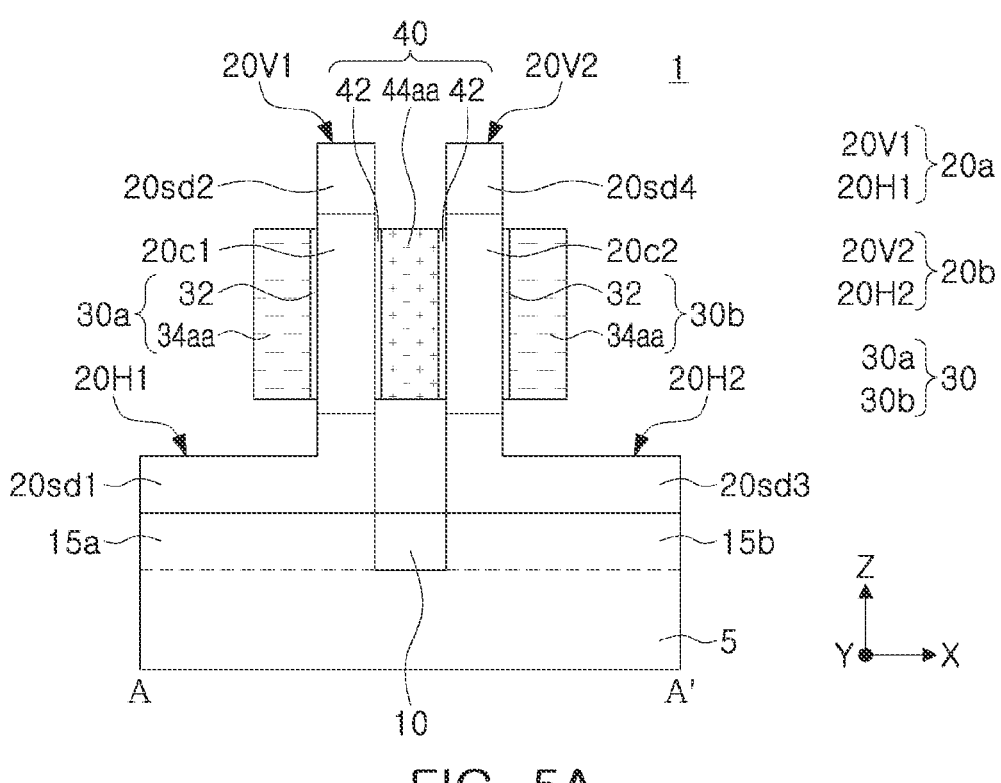
FIG. 5A is a conceptual cross-sectional view illustrating a modified example of a semiconductor device according to an example embodiment.

The gate electrode 34 and the back gate electrode 44 may be disposed on a level, substantially the same as a height level of the first and second vertical channel regions 20c1 and 20c2, as illustrated in FIGS. 1 and 2B, but example embodiments are not limited thereto. In a modified example embodiment, referring to FIG. 5A, the gate electrode 34 and the back gate electrode 44 may be modified as a gate electrode 34aa and a back gate electrode 44aa disposed on a level, lower than a level of upper surfaces of the first and second vertical channel regions 20c1 and 20c2, and disposed on a level, higher than a level of lower surfaces of the first and second vertical channel regions 20c1 and 20c2, as illustrated in FIG. 5A. Accordingly, the gate electrodes 34 and 34a and the back gate electrodes 44 and 44a described with reference to FIGS. 1 to 4D may be modified as the gate electrode 34aa and the back gate electrode 44aa.

Each of the first and second vertical channel regions 20c1 and 20c2 may have a vertical thickness, greater than a vertical thickness of each of the gate electrode 34aa and the back gate electrode 44aa.

Upper surfaces of the first and second vertical channel regions 20c1 and 20c2 may be lower surfaces of the second and fourth source/drains 20sd2 and 20sd4, and lower surfaces of the first and second vertical channel regions 20c1 and 20c2 may be upper surfaces of the first and third sources/drains 20sd1 and 20sd3 within the vertical portions 20V1 and 20V2.

Figure 5B:
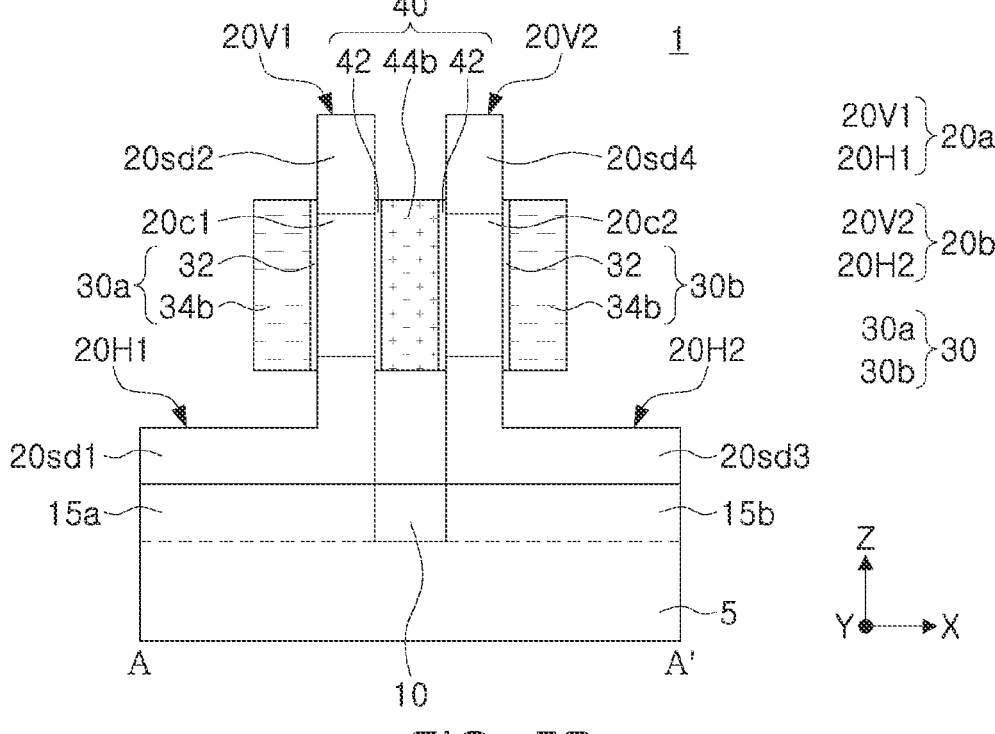
FIG. 5B is a conceptual cross-sectional view illustrating a modified example of a semiconductor device according to an example embodiment.

In a modified example embodiment, referring to FIG. 5B, the gate electrodes 34 and 34a and the back gate electrodes 44 and 44a described with reference to FIGS. 1 to 4D may be modified as a gate electrode 34b and a back gate electrode 44b disposed on a level, higher than a level of upper surfaces of the first and second vertical channel regions 20c1 and 20c2, and disposed on a level, lower than a level of lower surfaces of the first and second vertical channel regions 20c1 and 20c2.

Each of the first and second vertical channel regions 20c1 and 20c2 may have a vertical thickness, lower than a vertical thickness of each of the gate electrode 34aa and the back gate electrode 44aa.

The gate electrode 34b of the first gate structure 30a may cover a portion of a side surface of the first source/drain 20sd1, disposed in the first vertical potion 20V1, and a portion of a side surface of the second source/drain 20sd2 disposed in the first vertical potion 20V1. The gate electrode 34b of the second gate structure 30b may cover a portion of a side surface of the third source/drain 20sd3, disposed in the second vertical portion 20V2, and a portion of a side surface of the fourth source/drain 20sd4 disposed in the second vertical portion 20V2. The back gate electrode 44b may cover a portion of a side surface of each of the first to fourth sources/drains 20sd1, 20sd2, 20sd3, and 20sd4 disposed in the first vertical portion 20V1 and the second vertical portion 20V2.

Figure 5C:
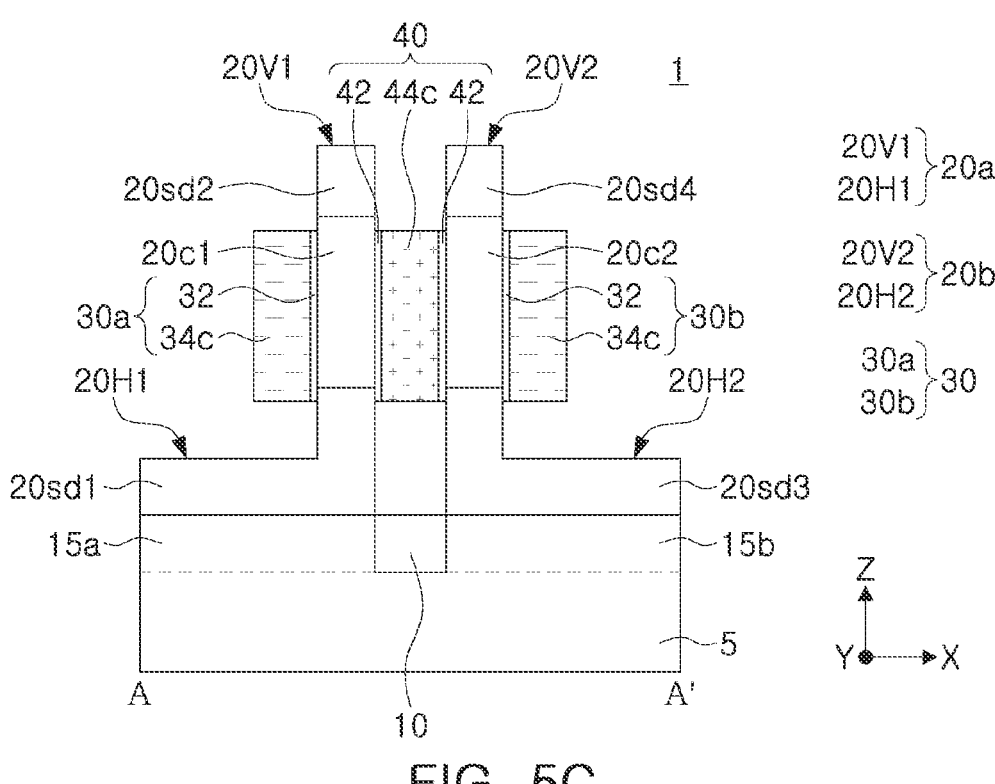
FIG. 5C is a conceptual cross-sectional view illustrating a modified example of a semiconductor device according to an example embodiment.

In a modified example embodiment, referring to FIG. 5C, the gate electrodes 34 and 34a and the back gate electrodes 44 and 44a described with reference to FIGS. 1 to 4D may be modified as a gate electrode 34c and a back gate electrode 44c disposed on a level, lower than a level of upper surfaces of the first and second vertical channel regions 20c1 and 20c2, and disposed on a level, lower than a level of lower surfaces of the first and second vertical channel regions 20c1 and 20c2.

Figure 5D:
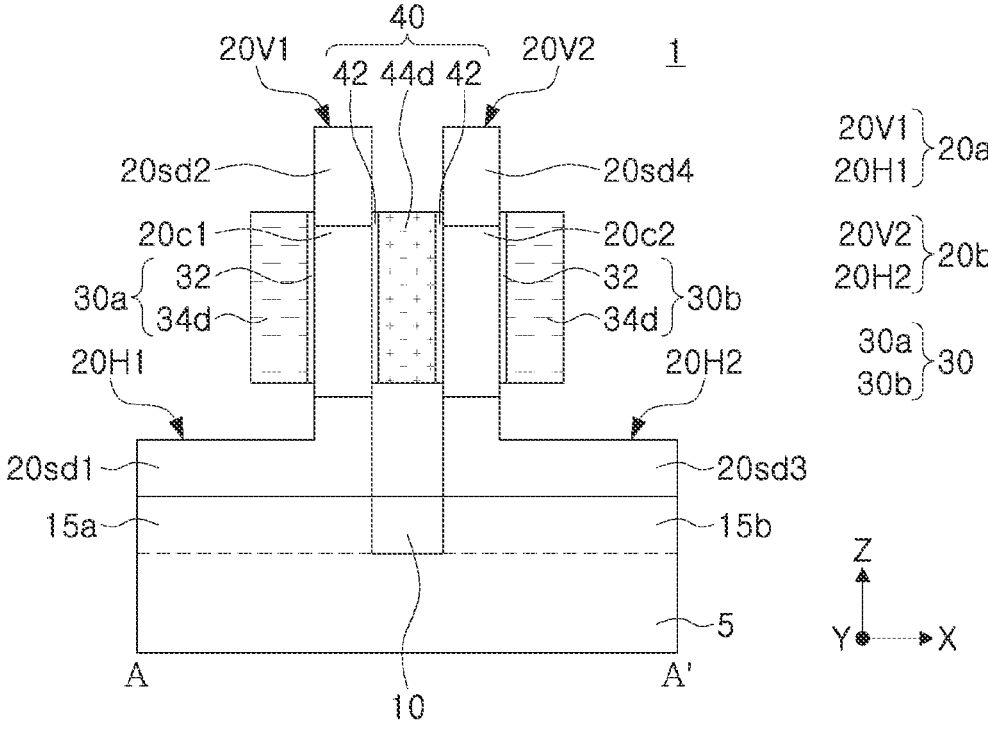
FIG. 5D is a conceptual cross-sectional view illustrating a modified example of a semiconductor device according to an example embodiment.

In a modified example embodiment, referring to FIG. 5D, the gate electrodes 34 and 34a and the back gate electrodes 44 and 44a described with reference to FIGS. 1 to 4D may be modified as a gate electrode 34d and a back gate electrode 44d disposed on a level, higher than a level of upper surfaces of the first and second vertical channel regions 20c1 and 20c2, and disposed on a level, higher than a level of lower surfaces of the first and second vertical channel regions 20c1 and 20c2.

In the cross-sectional structure of FIG. 2B, the gate electrode 34 may have substantially the same the width as the back gate electrode 44, but example embodiments are not limited thereto. For example, in a cross-sectional structure in which the first and second horizontal portions 20H1 and 20H2 are taken in a length direction, for example, a first direction X, the gate electrode 34, 34a, 34aa, 34b, 34c, and 34d and the back gate electrodes 44, 44a, 44aa, 44b, 44c, and 44d, described with reference to FIGS. 1 to 5D, may have the same or substantially the same width, but example embodiments are not limited thereto. In a modified example embodiment, referring to FIG. 6A, in the cross-sectional structure in which the first and second horizontal portions 20H1 and 20H2 are taken in the length direction, for example, the first direction X, the gate electrode 34, 34a, 34aa, 34b, 34c, 34d and the back gate electrodes 44, 44a, 44aa, 44b, 44c, 44d, described with reference to FIGS. 1 to 5D, may be modified as a gate electrode 34e and a back gate electrode 44e having different widths. For example, in the cross-sectional structure in which the first and second horizontal portions 20H1 and 20H2 are taken in the length direction, for example, the first direction X, the gate electrode 44e may have a first width and the back gate electrode 34e may have a second width, greater than the first width. In the gate electrode 34e, a portion having the first width may be a portion covering the first side surface 20S1 of the first vertical portion 20V1. In the back gate electrode 44e, a portion having the second width may be a portion covering the second side surface 20S2 of the first vertical portion 20V1.

Figure 6A:
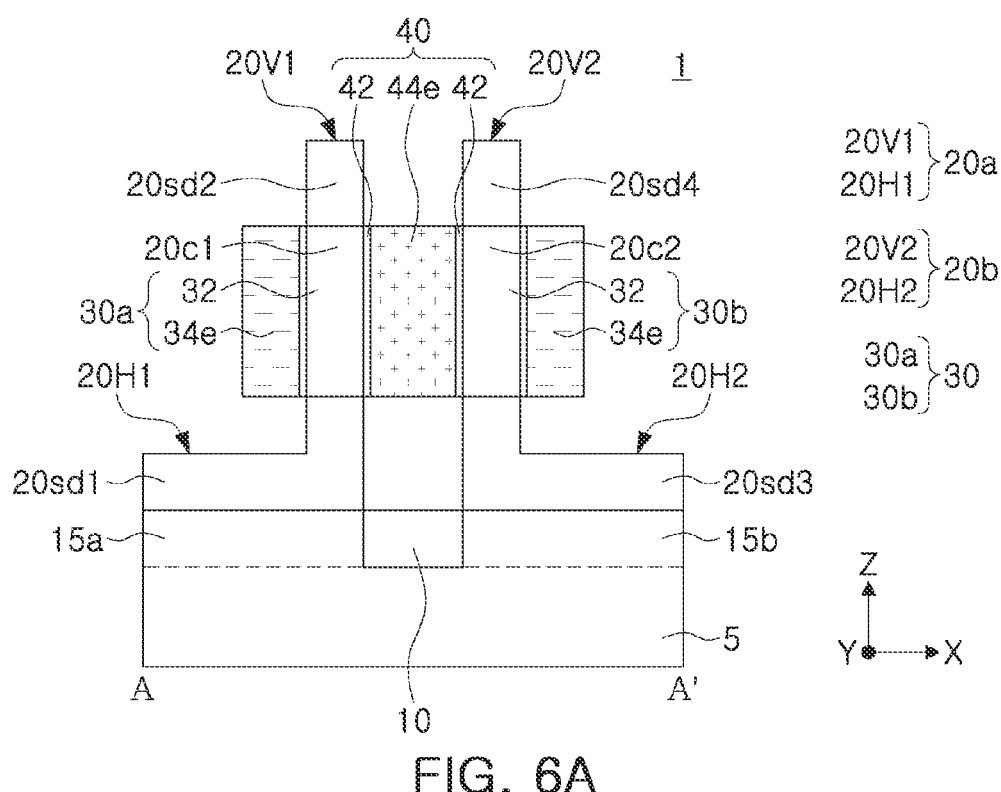
FIG. 6A is a conceptual cross-sectional view illustrating a modified example of a semiconductor device according to an example embodiment.
Figure 6B:
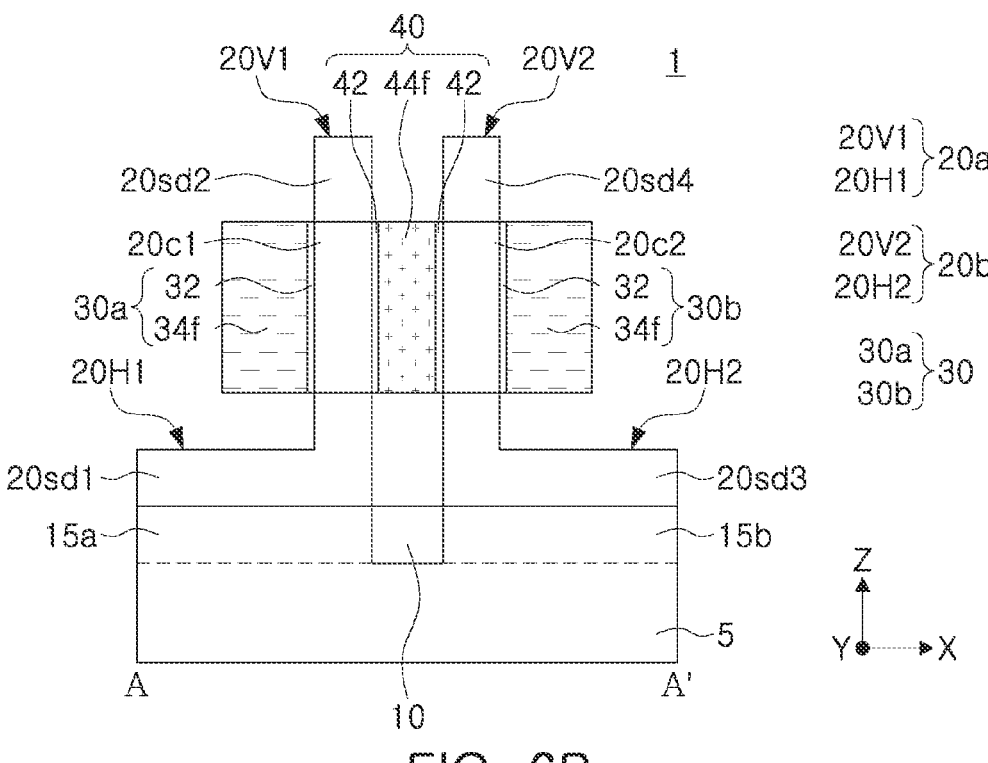
FIG. 6B is a conceptual cross-sectional view illustrating a modified example of a semiconductor device according to an example embodiment.

In a modified example embodiment, referring to FIG. 6B, the gate electrode 34e and the back gate electrode 44e illustrated in FIG. 6A may be modified as a gate electrode 34f and a back gate electrode 44f illustrated in FIG. 6B. For example, in a cross-sectional structure in which the first and second horizontal portions 20H1 and 20H2 are taken in a length direction, for example, a first direction X, the gate electrode 34f may have a width, greater than a width of the back gate electrode 44f.

The gate electrodes 34, 34a, 34aa, 34b, 34c, 34d, 34e, 34f and the back gate electrodes 44, 44a, 44aa, 44b, 44c, 44d, 44e, and 44f, described with reference to FIGS. 1 to 6B, may have substantially the same vertical thickness, but example embodiments are not limited thereto. In a modified example embodiment, referring to FIG. 7A, the gate electrodes 34, 34a, 34aa, 34b, 34c, 34d, 34e, and 34f and the back gate electrodes 44, 44a, 44aa, 44b, 44c, 44d, 44e, and 44f, described with reference to FIGS. 1 to 6B, may be modified as a gate electrode 34g and a back gate electrode 44g having different vertical thicknesses. The gate electrode 34g may have a vertical thickness, greater than a vertical thickness of the back gate electrode 44g. An upper surface of the gate electrode 34g may be disposed on a level, higher than a level of an upper surface of the back gate electrode 44g, and a lower surface of the gate electrode 34g may be disposed on a level, lower than a level of a lower surface of the back gate electrode 44g.

In a modified example embodiment, referring to FIG. 7B, the gate electrodes 34, 34a, 34aa, 34b, 34c, 34d, 34e, and 34f and the back gate electrodes 44, 44a, 44aa, 44b, 44c, 44d, 44e, and 44f, described with reference to FIGS. 1 to 6B, may be modified as a gate electrode 34h and a back gate electrode 44h illustrated in FIG. 7B. The gate electrode 34h may have a vertical thickness, less than a vertical thickness of the back gate electrode 44h. An upper surface of the gate electrode 34h may be disposed on a level, lower than a level of an upper surface of the back gate electrode 44h, and a lower surface of the gate electrode 34h may be disposed on a level, higher than a level of a lower surface of the back gate electrode 44h.

Figure 8A:
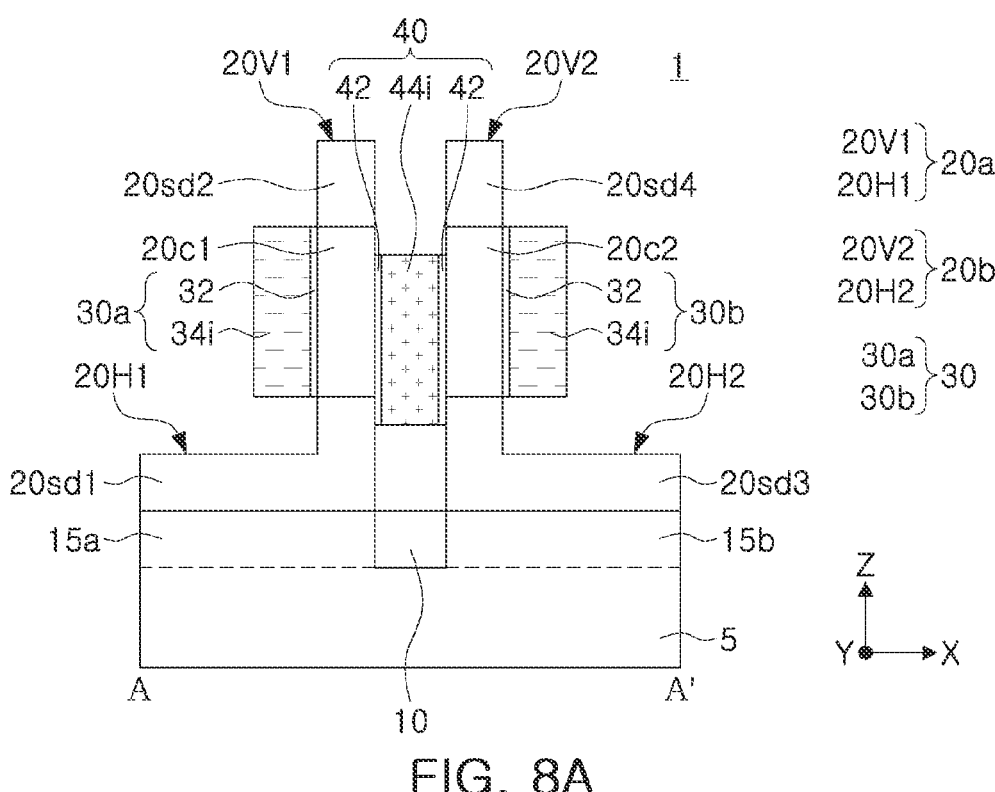
FIG. 8A is a conceptual cross-sectional view illustrating a modified example of a semiconductor device according to an example embodiment.

In a modified example embodiment, referring to FIG. 8A, the gate electrodes 34, 34a, 34aa, 34b, 34c, 34d, 34e, and 34f and the back gate electrodes 44, 44a, 44aa, 44b, 44c, 44d, 44e, and 44f, described with reference to FIGS. 1 to 6B, may be modified as a gate electrode 34i and a back gate electrode 44i illustrated in FIG. 8A. An upper surface of the gate electrode 34i may be disposed on a level, higher than a level of an upper surface of the back gate electrode 44i, and a lower surface of the gate electrode 34i may be disposed on a level, higher than a level of a lower surface of the back gate electrode 44i.

Figure 8B:
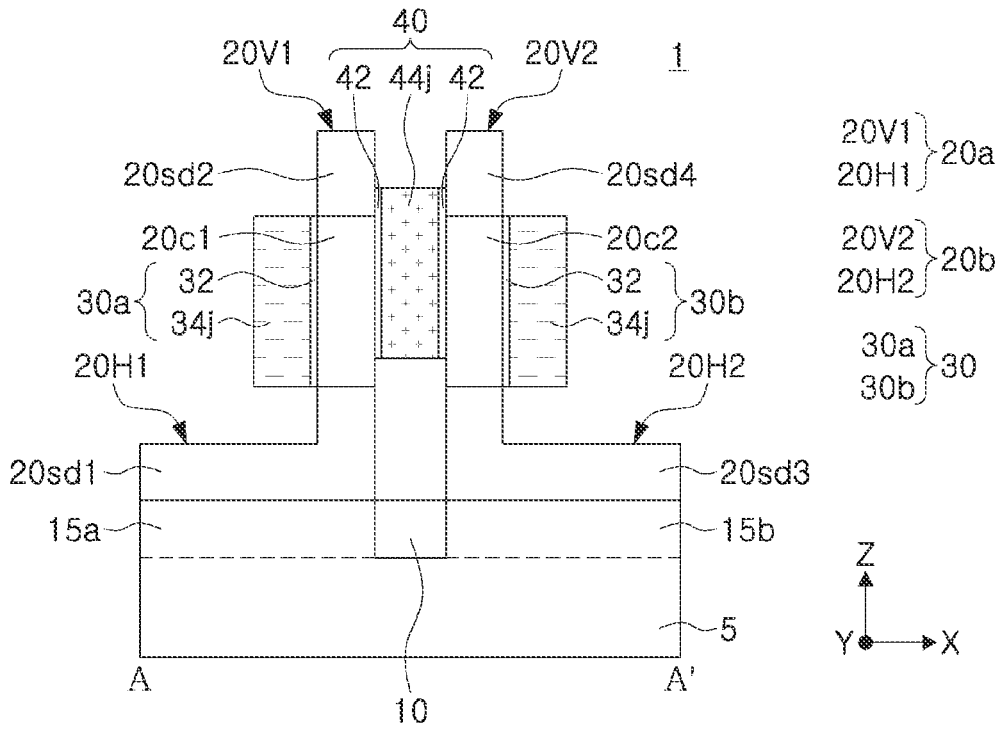
FIG. 8B is a conceptual cross-sectional view illustrating a modified example of a semiconductor device according to an example embodiment.

In a modified example embodiment, referring to FIG. 8B, the gate electrodes 34, 34a, 34aa, 34b, 34c, 34d, 34e, and 34f and the back gate electrodes 44, 44a, 44aa, 44b, 44c, 44d, 44e, and 44f, described with reference to FIGS. 1 to 6B, may be modified as a gate electrode 34j and a back gate electrode 44j illustrated in FIG. 8B. An upper surface of the gate electrode 34j may be disposed on a level, lower than a level of an upper surface of the back gate electrode 44j, and a lower surface of the gate electrode 34j may be disposed on a level, lower than a level of a lower surface of the back gate electrode 44j.

Figure 9:
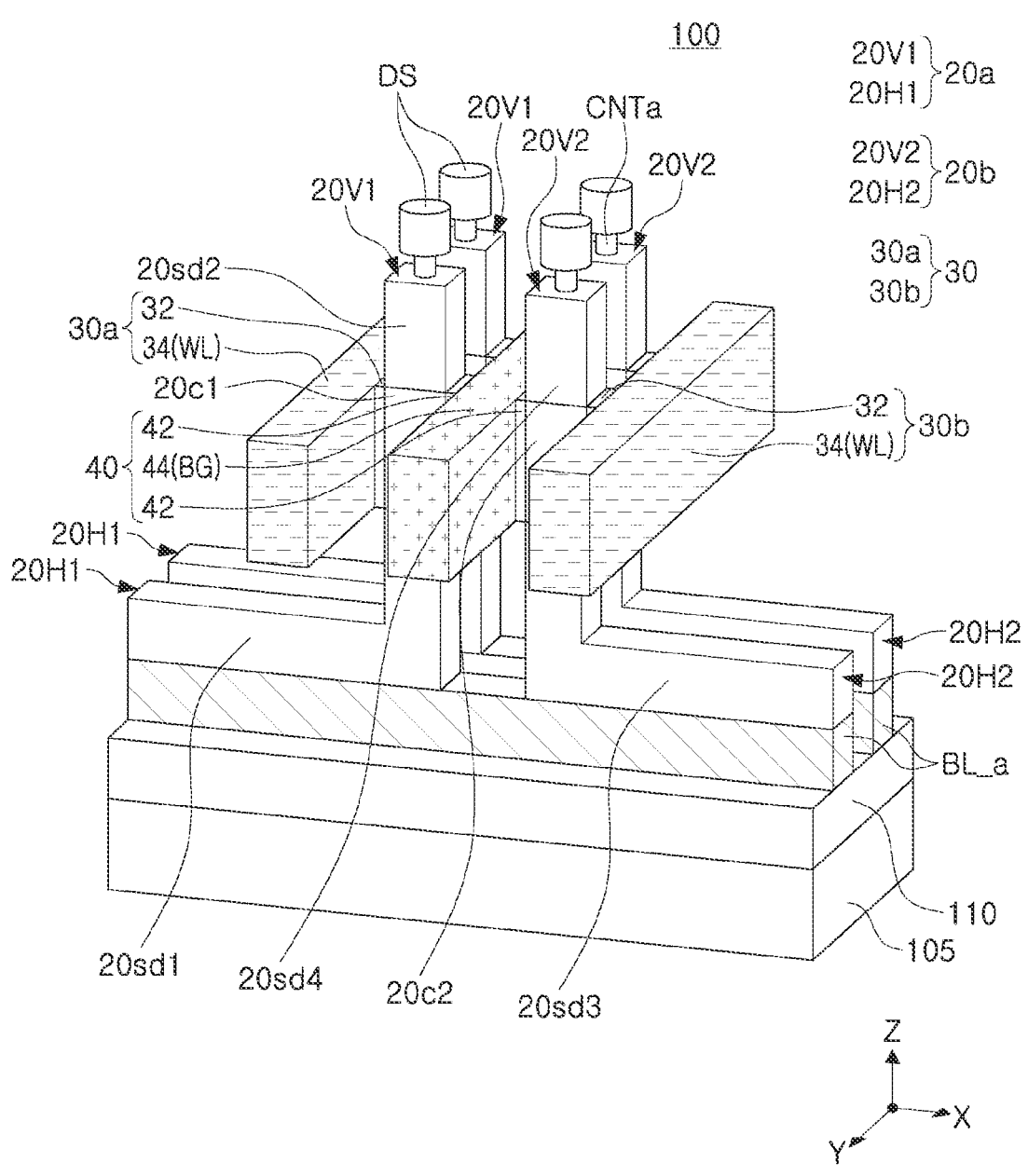
FIG. 9 is a conceptual perspective view illustrating an example of a semiconductor device according to an example embodiment.
Figure 10:
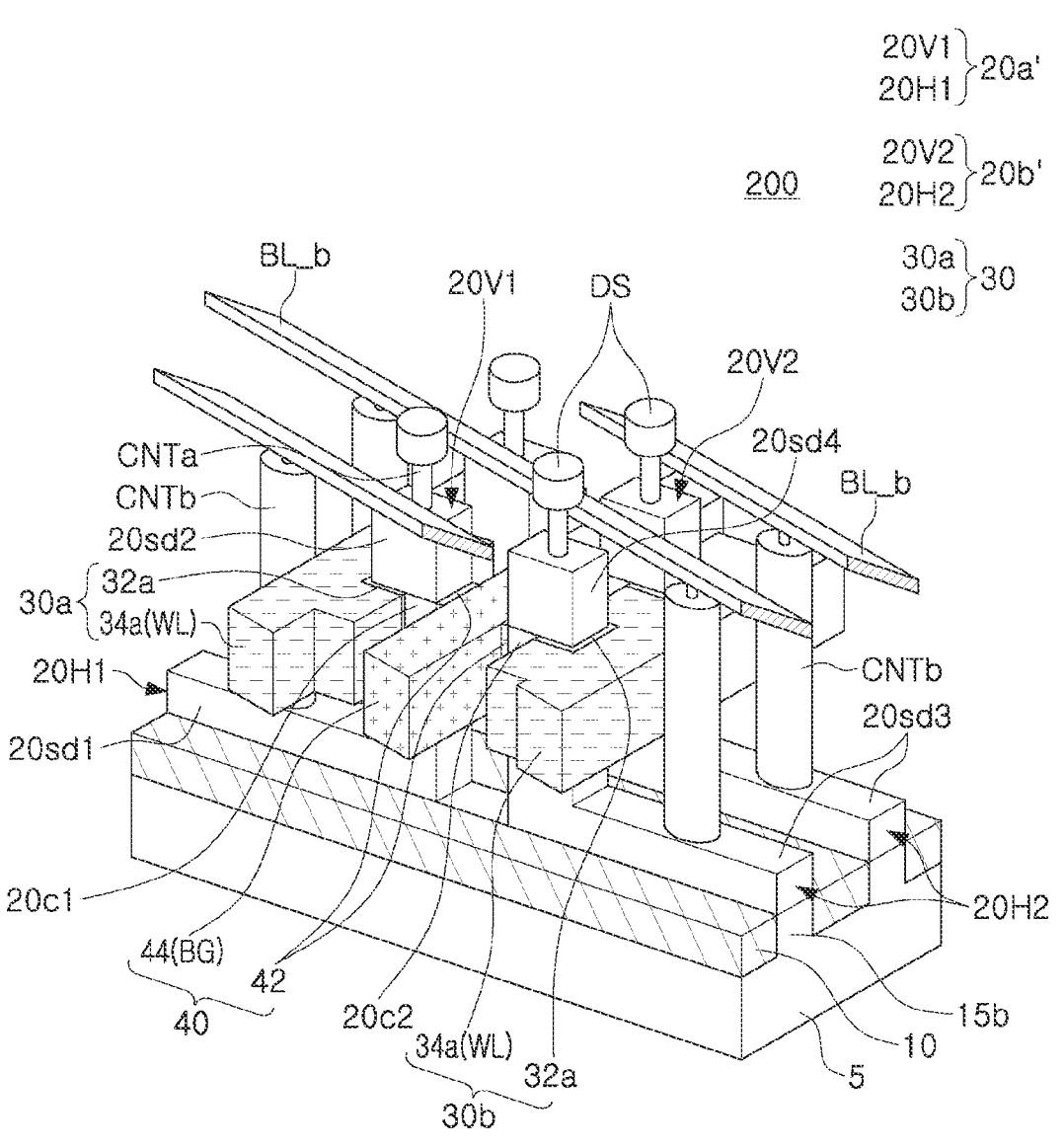
FIG. 10 is a conceptual perspective view illustrating another example of a semiconductor device according to an example embodiment.

The semiconductor device 1 described with reference to FIGS. 1 to 8B may be a memory device. As described in FIGS. 1 to 2B, the length direction of each of the horizontal portions 20H1 and 20H2 may be perpendicular or substantially perpendicular to the second direction Y or may be inclined with respect to the second direction Y. A semiconductor device, which may be a memory device, will be described with reference to FIGS. 9 and 10. FIG. 9 is a conceptual perspective view illustrating an example in which the length direction of each of the horizontal portions 20H1 and 20H2 is perpendicular or substantially perpendicular to the second direction Y and the above-described semiconductor device 1 is a memory device, and FIG. 10 is a conceptual perspective view illustrating an example in which the length direction of each of the horizontal portions 20H1 and 20H2 is inclined with respect to the second direction Y and the above-described semiconductor device 1 is a memory device.

In an example embodiment, referring to FIG. 9, the semiconductor device 100 may include a substrate 105, a peripheral circuit structure 110 on the substrate 105, and bit lines BL_a on the peripheral circuit structure 110.

The semiconductor device 100 may further include the first and second structures 20a and 20b as illustrated in FIGS. 1 to 8B. As illustrated in FIGS. 1 to 8B, the first structure 20a may include the first horizontal portion 20H1 and the first vertical portion 20V1, and the second structure 20b may include the second horizontal portion 20H2 and the second vertical portion 20V2. As illustrated in FIGS. 1 to 8B, the first structure 20a may include the first and second sources/drains 20sd1 and 20sd2 and the first vertical channel region 20c1, and the second structure 20b may include the third and fourth sources/drains 20sd3 and 20sd4 and the second vertical channel region 20c2.

The bit lines BL_a may be electrically connected to the first and third source/drains 20sd1 and 20sd3 of the first and second structures 20a and 20b. The bit lines BL_a may be in contact with the first and third sources/drains 20sd1 and 20sd3 of the first and second structures 20a and 20b. The first and second structures 20a and 20b adjacent to each other may be disposed on one of the bit lines BL_a.

At least a portion of each of the bit lines BL_a may be disposed on a level, higher than a level of the vertical portions 20V1 and 20V2.

The semiconductor device 100 may further include the gate structures 30 and the back gate structure 40 as described with reference to FIGS. 1 to 8B. For example, each of the gate structures 30 may include the gate electrode 34 as illustrated in FIG. 1, and the back gate structure 40 may include the back gate electrode 44 as illustrated in FIG. 1. The gate electrodes 34 may be word lines WL of a memory device, and the back gate electrode 44 may be a back gate line BG for controlling the vertical channel regions 20c1 and 20c2 in the memory device.

The substrate 105 may be a semiconductor substrate. The bit lines BL_a may be formed of a conductive material. The peripheral circuit structure 110 may be a peripheral circuit region, in which a circuit for operating at least one of the word lines WL, the bit lines BL_a, and the back gate line BG may be disposed, in the memory device.

In a plan view, the bit lines BL_a may vertically intersect the gate structures 30 and the back gate structure 40.

The semiconductor device 100 may further include a data storage structure DS on the second and fourth sources/drains 20*sd*2 and 20*sd*4, and contact structures CNTa electrically connecting the second and fourth sources/drains 20*sd*2 and 20*sd*4 and the data storage structure DS to each other between the second and fourth sources/drains 20*sd*2 and 20*sd*4 and the data storage structure DS.

The data storage structure DS may be a data storage structure of a DRAM, for example, memory cell capacitors storing data in a DRAM, but example embodiments are not limited thereto. For example, the data storage structure DS may be an MRAM data storage structure or an FeRAM data storage structure.

In another example embodiment, referring to FIG. 10, the semiconductor device 200 may include the substrate 5, the active regions 15*b*, and the isolation region 10 as illustrated in FIGS. 1 and 2B.

The semiconductor device 200 may further include first and second structures 20*a*' and 20*b*', substantially the same as or similar to the first and second structures 20*a* and 20*b*described with reference to FIGS. 1 to 8B. Similarly to what is illustrated in FIGS. 1 to 8B, the first structure 20*a*' may include the first horizontal portion 20H1 and the first vertical portion 20V1, and the second structure 20*b*' may include the second horizontal portion 20H2 and the second vertical portion 20V2. Similarly to what is illustrated in FIGS. 1 to 8B, the first structure 20*a*' may include the first and second sources/drains 20*sd*1 and 20*sd*2 and the first vertical channel region 20*c*1, and the second structure 20*b*' may include the third and fourth sources/drains 20*sd*3 and 20*sd*4 and the second vertical channel region 20*c*2.

The semiconductor device 200 may further include gate structures 30 and the back gate structure 40 as described with reference to FIGS. 1 to 8B. For example, each of the gate structures 30 may include the gate electrode 34*a* having a tri-gate structure as illustrated in FIG. 3A, and the back gate structure 40 may include the back gate electrode 44 as illustrated in FIG. 3A. The gate electrodes 34*a* may be word lines WL of a memory device, and the back gate electrode 44 is a back gate line BG for controlling the vertical channel regions 20*c*1 and 20*c*2 in the memory device.

The semiconductor device 200 may further include bit line contact plugs CNTb contacting the first and second horizontal portions 20H1 and 20H2 and electrically connected to the first and second horizontal portions 20H1 and 20H2, on the first and second horizontal portions 20H1 and 20H2. The bit line contact plugs CNTb may be electrically connected to the first and third sources/drains 20*sd*1 and 20*sd*3 while contacting the first and third sources/drains 20*sd*1 and 20*sd*3.

The bit line contact plugs CNTb may include doped polysilicon, a metal, a conductive metal nitride, a conductive metal silicide, a conductive metal oxide, or combinations thereof, but example embodiments are not limited thereto. For example, the bit line contact plugs CNTb may include a conductive two-dimensional (2D) semiconductor material, and the 2D semiconductor material may include graphene, carbon nanotubes, or combinations thereof.

The semiconductor device 200 may further include bit lines BL_b electrically connected to the bit line contact plugs CNTb on the bit line contact plugs CNTb.

In a plan view, the bit lines BL_b may vertically intersect the gate structures 30 and the back gate structure 40.

In a plan view, length directions of the first and second horizontal portions 20H1 and 20H2 of the first and second structures 20*a*' and 20*b*' may obliquely intersect the bit line BL_b rather than being perpendicular thereto, and may obliquely intersect the gate structures 30 and the back gate structure 40 rather than being perpendicular thereto.

As illustrated in FIG. 10, the semiconductor device 200 may further include the data storage structure DS on the second and fourth sources/drains 20*sd*2 and 20*sd*4 and the contact structures CNTa electrically connecting the second and fourth sources/drains 20*sd*2 and 20*sd*4 and the data storage structure DS to each other between the second and fourth sources/drains 20*sd*2 and 20*sd*4 and the data storage structure DS.

Figure 11:
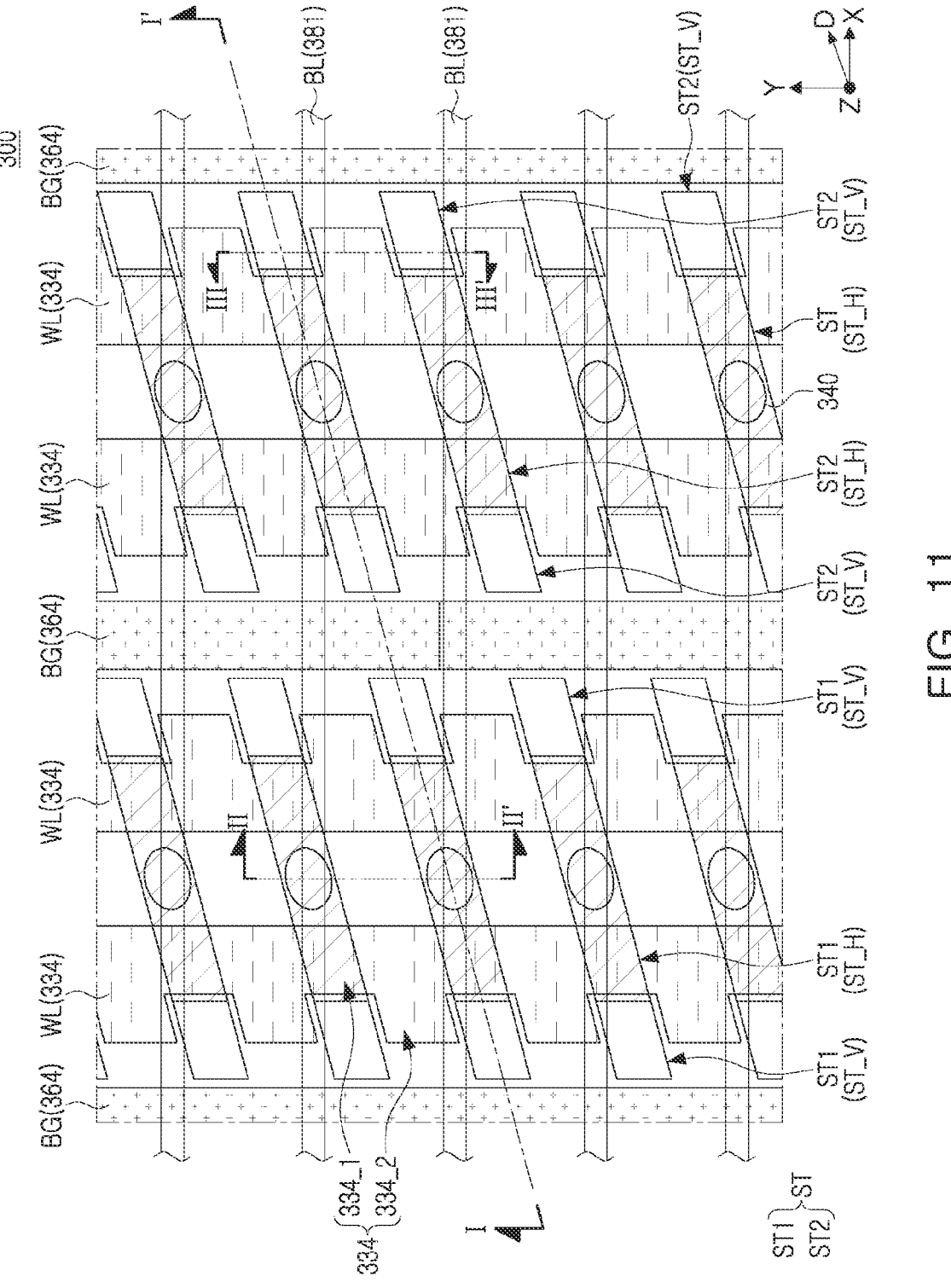
FIGS. 11 and 12 are conceptual views illustrating a modified example of a semiconductor device according to an example embodiment.
Figure 12:
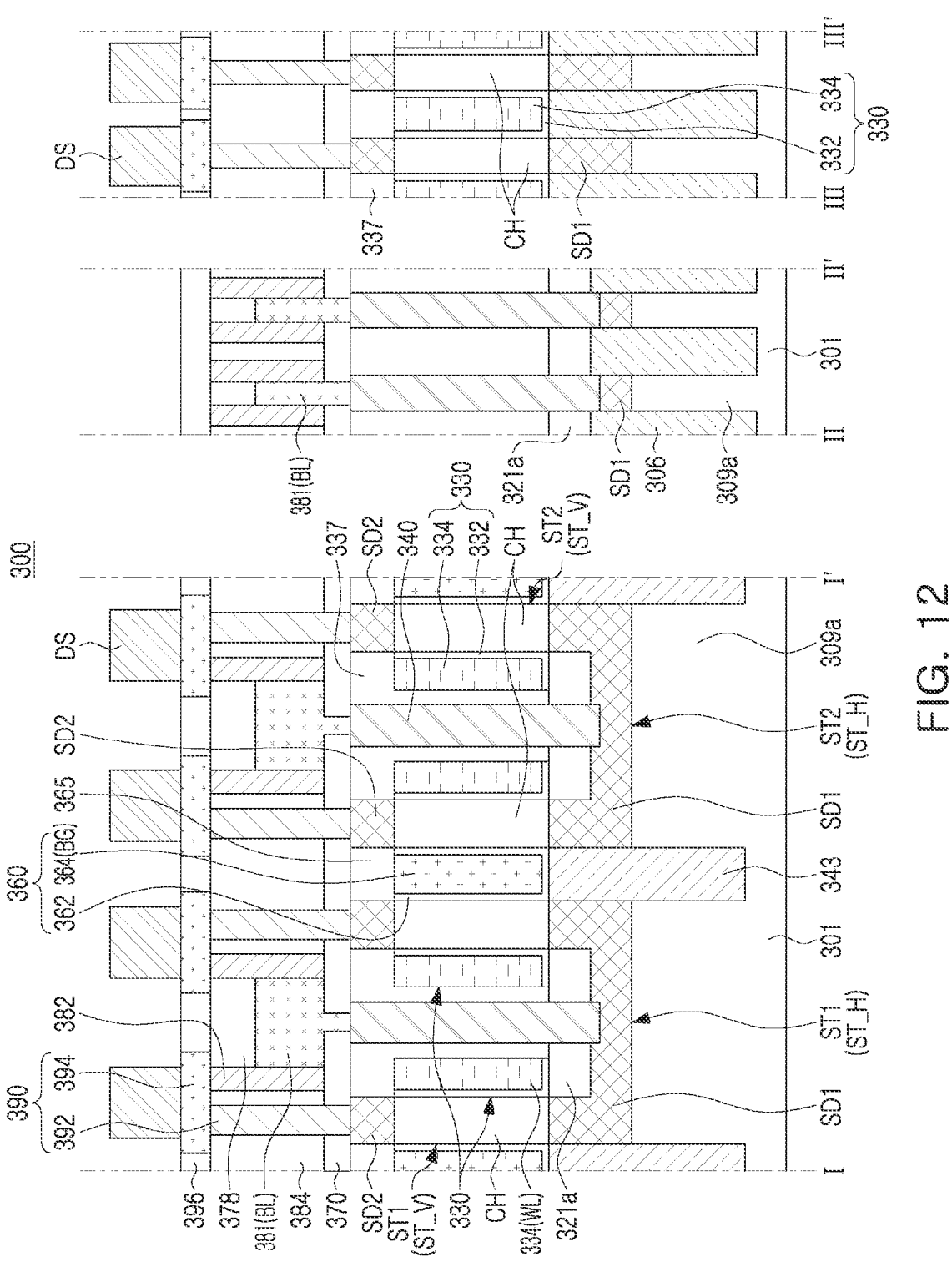

The semiconductor devices 1, 100, and 200 according to the above-described embodiments have been described as including the first vertical portion 20V1 extending upwardly from one side of a single horizontal portion, for example, the first horizontal portion 20H1 in a length direction, but example embodiments are not limited thereto. For example, as described in FIGS. 1, 2A and 2B, each of the structures 20*a* and 20*b* may include a pair of vertical portions extending upwardly from opposite sides of the single horizontal portion in the length direction. As described above, an example in which a pair of vertical portions extending upwardly from opposite sides of the single horizontal portion in the length direction are disposed will be described with reference to FIGS. 11 and 12. FIGS. 11 and 12 are views illustrating an example embodiment in which a pair of vertical portions extending upwardly from opposite sides of the single horizontal portion 20H1 in the length direction are disposed in each of the first and second structures 20*a*' and 20*b*'. FIG. 11 is a conceptual plan view illustrating an example of a semiconductor device according to an example embodiment, and FIG. 12 is a cross-sectional view illustrating regions taken along lines I-I', II-II', and III-III' of FIG. 11.

Referring to FIGS. 11 and 12, a semiconductor device 300 according to an example embodiment may include a substrate 301 and isolation layers 306 and 343 defining active regions 309*a* on the substrate 301. The isolation layers 306 and 343 may include a first isolation layer 306 and a second isolation layer 343. The substrate 301 may be a semiconductor substrate. The isolation layers 306 and 343 may be formed of an insulating material.

The semiconductor device 300 may further include structures ST disposed on the active regions 309*a*. The structures ST may include first structures ST1 and second structures ST2. Each of the first and second structures ST1 and ST2 may include a single horizontal portion ST_H and vertical portions ST_V extending upwardly from opposite sides of the horizontal portion ST_H in a length direction. Accordingly, each of the first and second structures ST1 and ST2 may include a single horizontal portion ST_H and two vertical portions ST_V.

Each of the first and second structures ST1 and ST2 may include a lower source/drain SD1 disposed in the horizontal portion ST_H and extending inwardly of a lower region of each of the vertical portions ST_V, upper sources/drains SD2 disposed in upper regions of the vertical portions ST_V, and vertical channel regions CH disposed between the lower source/drain SD1 and the upper source/drain SD2 in the vertical portions ST_V. Each of the vertical portions ST_V may be substantially the same as the above-described vertical portion, for example, each of the first and second vertical portions 20V1 and 20V2 described with reference to FIGS. 1 to 2B.

The semiconductor device 300 may further include gate structures 330 and a back gate structure 360. The gate structures 330 may include a pair of gate structures 330 disposed between a pair of vertical portions ST_V on any one horizontal portion ST_H, among the horizontal portions ST_H, and spaced apart from each other. Each of the pair of gate structures 330 may include a gate dielectric layer 332, contacting the vertical channel regions CH of the vertical portions ST_V, and a gate electrode 334 on any one horizontal portion ST_H, among the horizontal portions ST_H. The gate dielectric layer 332 may cover a bottom surface of the gate electrode 334 while covering a side surface covering the vertical channel regions CH of the gate electrode 334. The gate electrodes 334 of the gate structures 330 may be word lines.

The gate electrodes 334 may have substantially the same structure and/or shape as any gate electrode, among the gate electrodes of the various example embodiments described with reference to FIGS. 1 to 10. The gate dielectric layer 332 may have substantially the same structure and/or shape as any one gate dielectric layer, among the gate dielectric layers of the various example embodiments described with reference to FIGS. 1 to 10.

The back gate structure 360 may pass through a space between the first structures ST1 and the second structures ST2 adjacent to each other in the length direction D of the horizontal portions ST_H.

The back gate structure 360 may include a back gate electrode 364 and a back gate dielectric layer 362 covering side surfaces and a bottom surface of the back gate electrode 364. The back gate electrode 364 may be a back gate BG.

The back gate electrode 364 may have substantially the same structure and/or shape as any one back gate electrode, among the back gate electrodes of the various example embodiments described with reference to FIGS. 1 to 10. The back gate dielectric layer 362 may have substantially the same structure and/or shape as any one back gate dielectric layer, among the back gate dielectric layers of the various example embodiments described with reference to FIGS. 1 to 10.

The semiconductor device 300 may further include an insulating layer 321a on the horizontal portions ST_H, an insulating layer 337 disposed between the vertical portions ST_V on the insulating layer 321a on the horizontal portions ST_H and covering the gate structures 330, and an insulating layer 365 on the back gate structure 360. The gate structures 330 may be disposed on the insulating layer 321a.

The semiconductor device 300 may further include contact plugs 340 penetrating through the insulating layers 337 and 321a and contacting the lower source/drains SD1 of the horizontal portions ST_H.

The semiconductor device 300 may further include conductive lines 381 disposed on the upper sources/drains SD2, the insulating layers 337 and 365, the insulating layer 370 and the contact plugs 340 and including a plug portion penetrating through the insulating layer 370. The conductive lines 381 may be bit lines BL.

The semiconductor device 300 may further includes bit line capping layers 378 on the bit lines BL, insulating spacers 382 covering side surfaces of the bit lines BL and the bit line capping layers 378, and an insulating layer 384 filling a space between the bit lines BL. The bit line capping layers 378 may be formed of an insulating material.

The semiconductor device 300 may further include contact plugs 392 penetrating through the insulating layers 384 and 370 and contacting and electrically connected to the upper source/drains SD2, conductive pads 394 electrically connected to the contact plugs 392 on the contact plugs 392, an insulating layer 396 between the conductive pads 394, and a data storage structure DS on the conductive pads 394. The contact plugs 392 and the conductive pads 394 may define a conductive portion 390.

In an example embodiment, a length direction D of the horizontal portions ST_H may obliquely intersect the bit lines BL rather than being perpendicular to the bit lines BL and may obliquely intersect the word lines WL rather than being perpendicular to the word lines WL, substantially the same as described with reference to FIG. 10.

In an example embodiment, the lower source/drain SD1 may be the first and third sources/drains 20sd1 and 20sd3 of FIGS. 1 to 10, and the upper source/drain SD2 may be the second and fourth sources/drains 20sd2 and 20sd4 of FIGS. 1 to 10. Accordingly, the first and third sources/drains 20sd1 and 20sd3 of FIGS. 1 to 10 may be referred to as lower sources/drains, and the second and fourth sources/drains 20sd2 and 20sd4 of FIGS. 1 to 10 may be referred to as upper sources/drains.

As described above, the gate structures 330 may have substantially the same structure and/or shape as any one gate structure, among the various gate structures 30 described with reference to FIGS. 1 to 10, and the back gate structure 360 may have substantially the same structure and/or shape as any one back gate structure, among the various back gate structures 40 described with reference to FIGS. 1 to 10. For example, the gate electrodes 334 of the gate structures 330 may have the same structure and/or shape as the gate electrodes 34a of the tri-gate structure as illustrated in FIG. 10. For example, each of the gate electrodes 334 may include a first gate portion 334_1 and a second gate portion 334_2, respectively corresponding to the first gate portion 34_1 and the second gate portion 34_2 described with reference to FIG. 3A.

Figure 13:
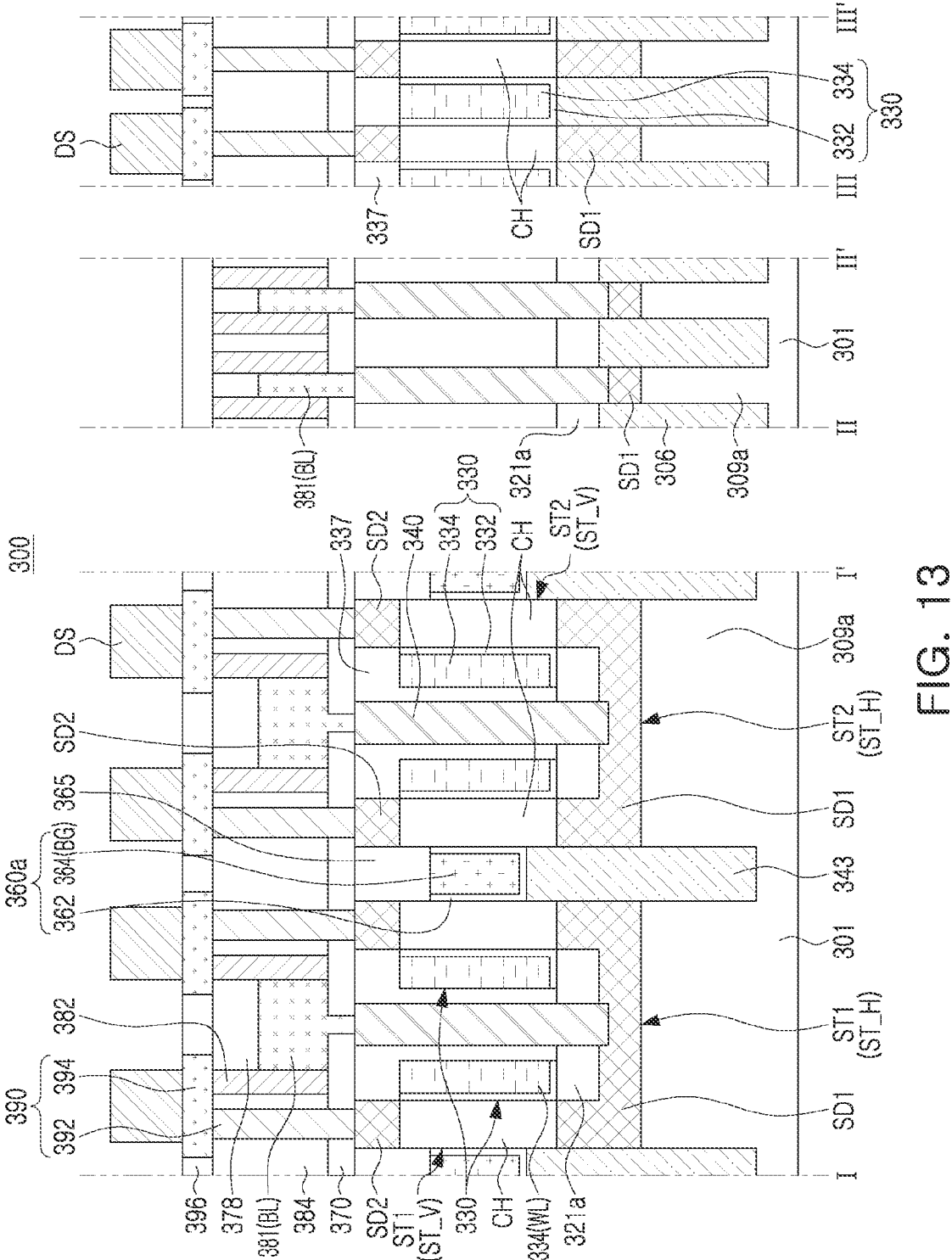
FIG. 13 is a conceptual cross-sectional view illustrating a modified example of a semiconductor device according to an example embodiment.

An example, in which the back gate structure 360 of FIG. 12 may be modified to have substantially the same structure and/or shape as any one back gate structure, among the various back gate structures 40 described with reference to FIGS. 1 to 10, will be described with reference to FIG. 13. FIG. 13 is a cross-sectional view corresponding to FIG. 12, and may conceptually illustrate an example in which the back gate structure 360 of FIG. 12 is modified.

Figure 7A:
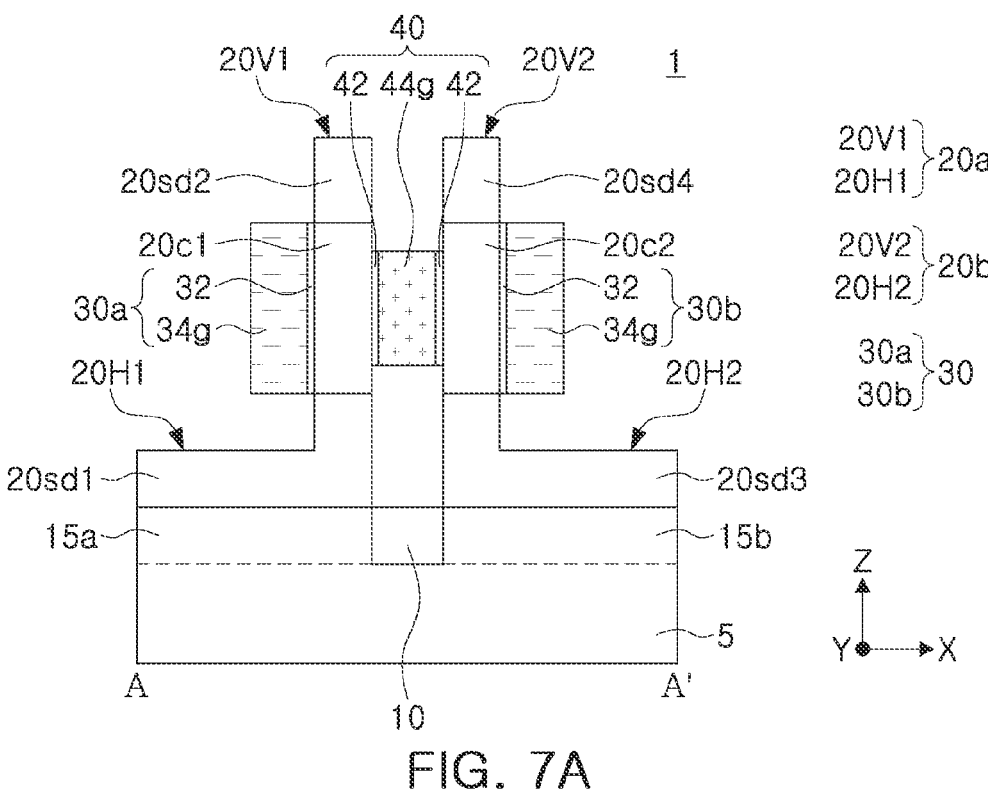
FIG. 7A is a conceptual cross-sectional view illustrating a modified example of a semiconductor device according to an example embodiment.
Figure 7B:
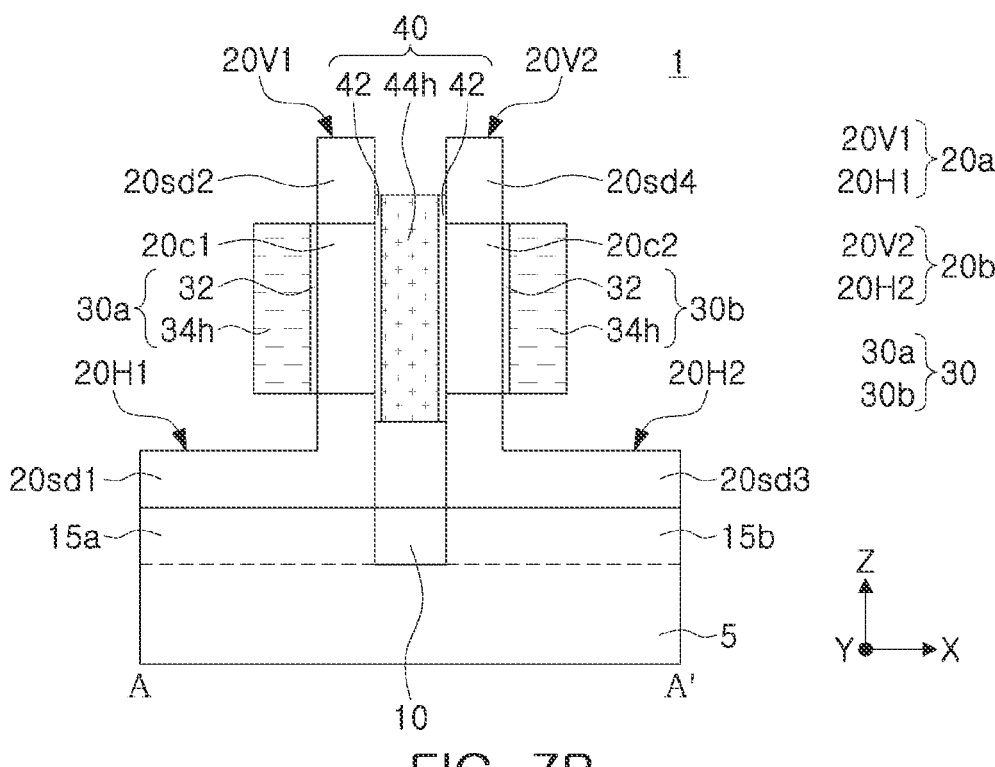
FIG. 7B is a conceptual cross-sectional view illustrating a modified example of a semiconductor device according to an example embodiment.

In a modified example embodiment, referring to FIG. 13, the back gate structure 360 of FIG. 12 may be modified to have substantially the same shape as the back gate structure 40 including the back gate electrode 44g as illustrated in FIG. 7A. For example, the back gate structure 360a modified as illustrated in FIG. 7A may have a vertical thickness, smaller than the vertical thickness of each of the gate structures 330, and may have an upper surface disposed on a level, lower than a level of upper surfaces of the gate structures 330, and a lower surface disposed on a level, higher than a level of lower surfaces of the gate structures 330. In some example embodiments, the gate structures 330 of FIG. 12 may be modified to have substantially the same structure and/or shape as any one gate structure, among the various gate structures 30 described with reference to FIGS. 1 to 10, and the back gate structure 360 of FIG. 12 may be modified to have substantially the same structure and/or shape as any one back gate structure, among the various back gate structures 40 described with reference to FIGS. 1 to 10.

Hereinafter, an example embodiment of a method of forming a semiconductor device according to an example embodiment will be described with reference to FIGS. 11 and 14A to 14J. FIGS. 14A to 14J are views illustrating a method of forming a semiconductor device of FIGS. 11 and 12, and are conceptual cross-sectional views illustrating regions taken along lines I-I', II-II', and III-III' of FIG. 11.

Figure 14A:
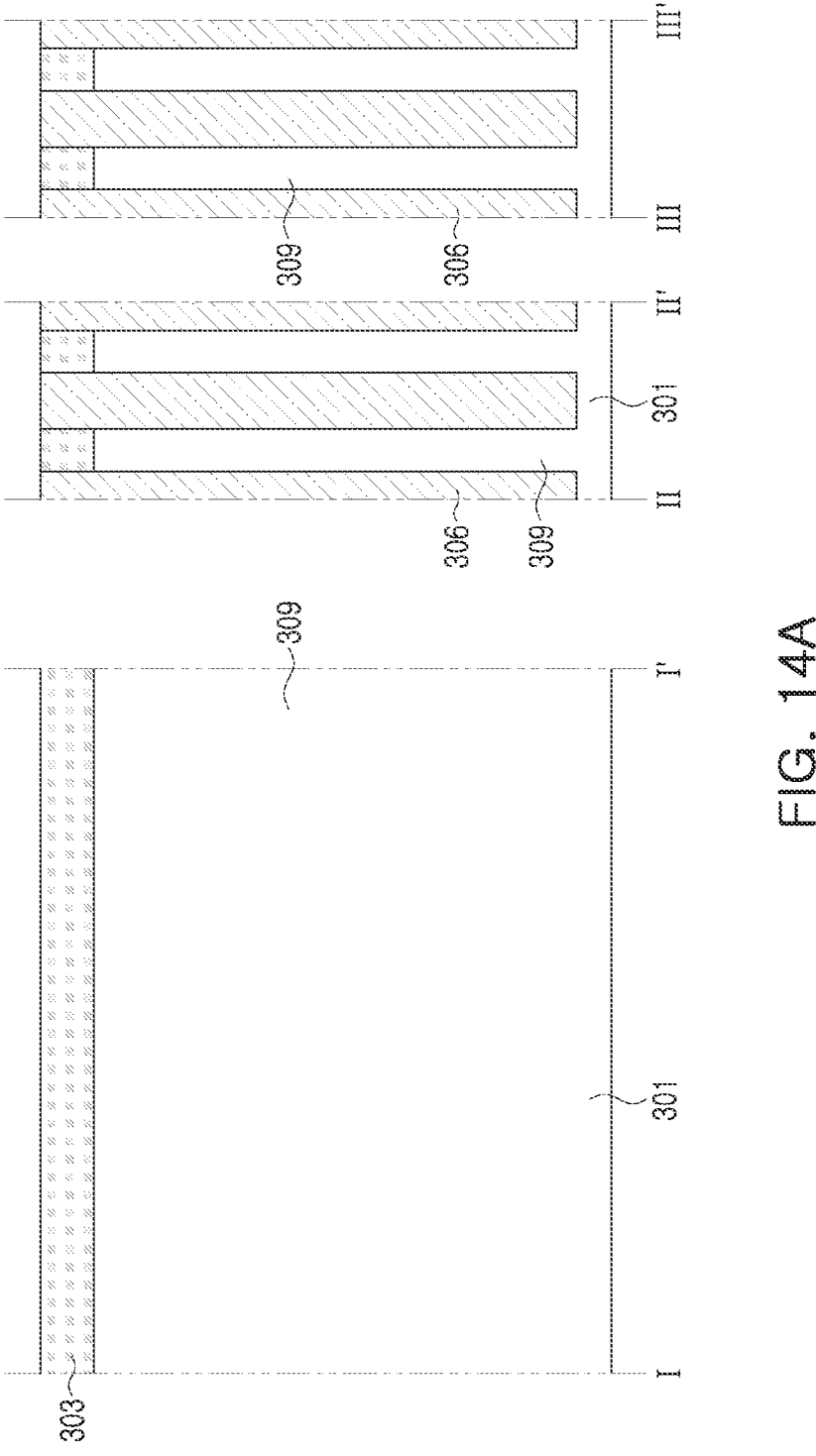
FIGS. 14A, 14B, 14C, 14D, 14E, 14F, 14G, 14H, 14I and 14J are conceptual cross-sectional views illustrating an example of a method of forming a semiconductor device according to an example embodiment.

Referring to FIGS. 11 and 14A, a mask pattern 303 may be formed on a substrate 301. The substrate 301 may be a semiconductor substrate. In an etching process using the mask pattern 303 as an etching mask, the substrate 301 may be etched to form a trench, and a first isolation layer 306 may be formed to fill the trench. A preliminary lower active region 309 may be defined below the mask pattern 303 by the first isolation layer 306.

Figure 14B:
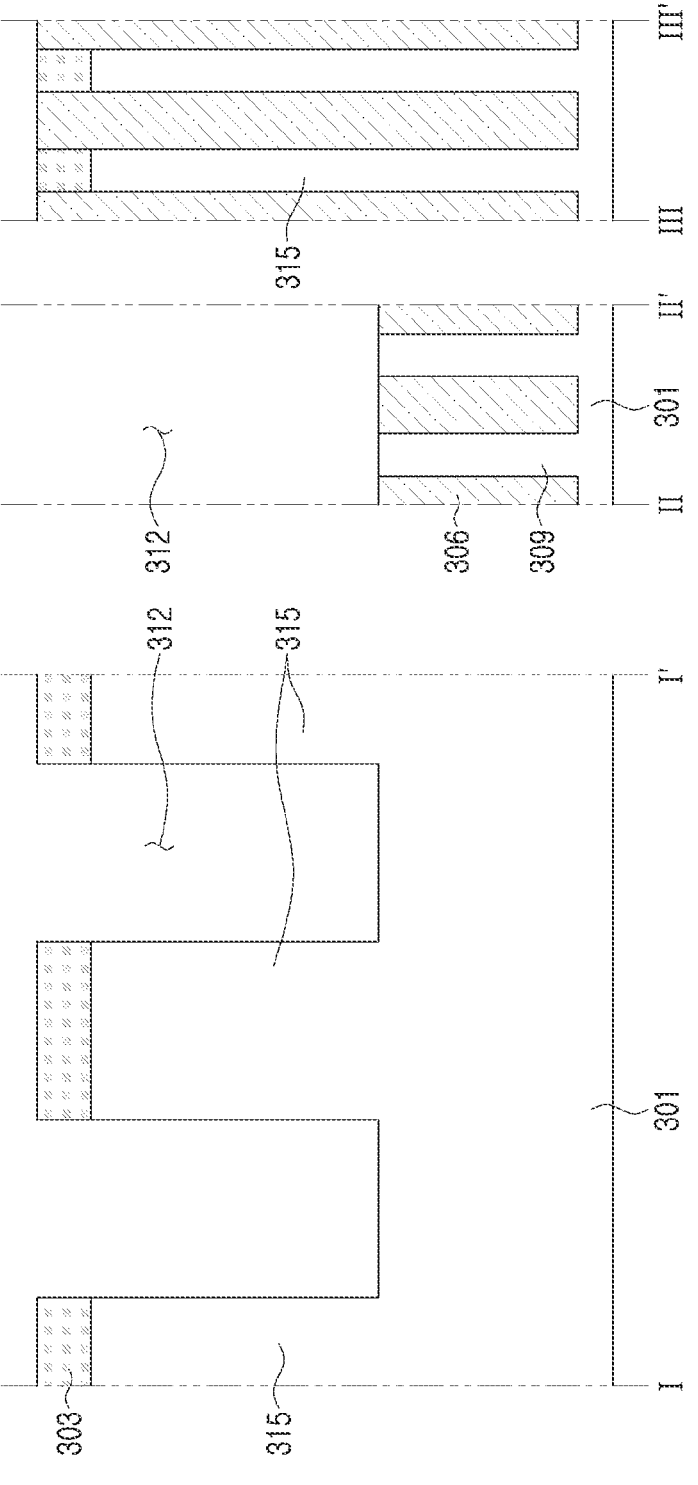

Referring to FIGS. 11 and 14B, trenches 312 may be formed to intersect the mask pattern 303, the first isolation layer 306, and the preliminary lower active region 309. The trenches 312 may penetrate through the mask pattern 303, and may reduce heights of the first isolation layer 306 and the preliminary lower active region 309. The preliminary lower active region 309, disposed to remain on a level higher than a level of bottom surfaces of the trenches 312, may be defined as the preliminary upper active region 315. Each of the trenches 312 may have a line shape.

Figure 14C:
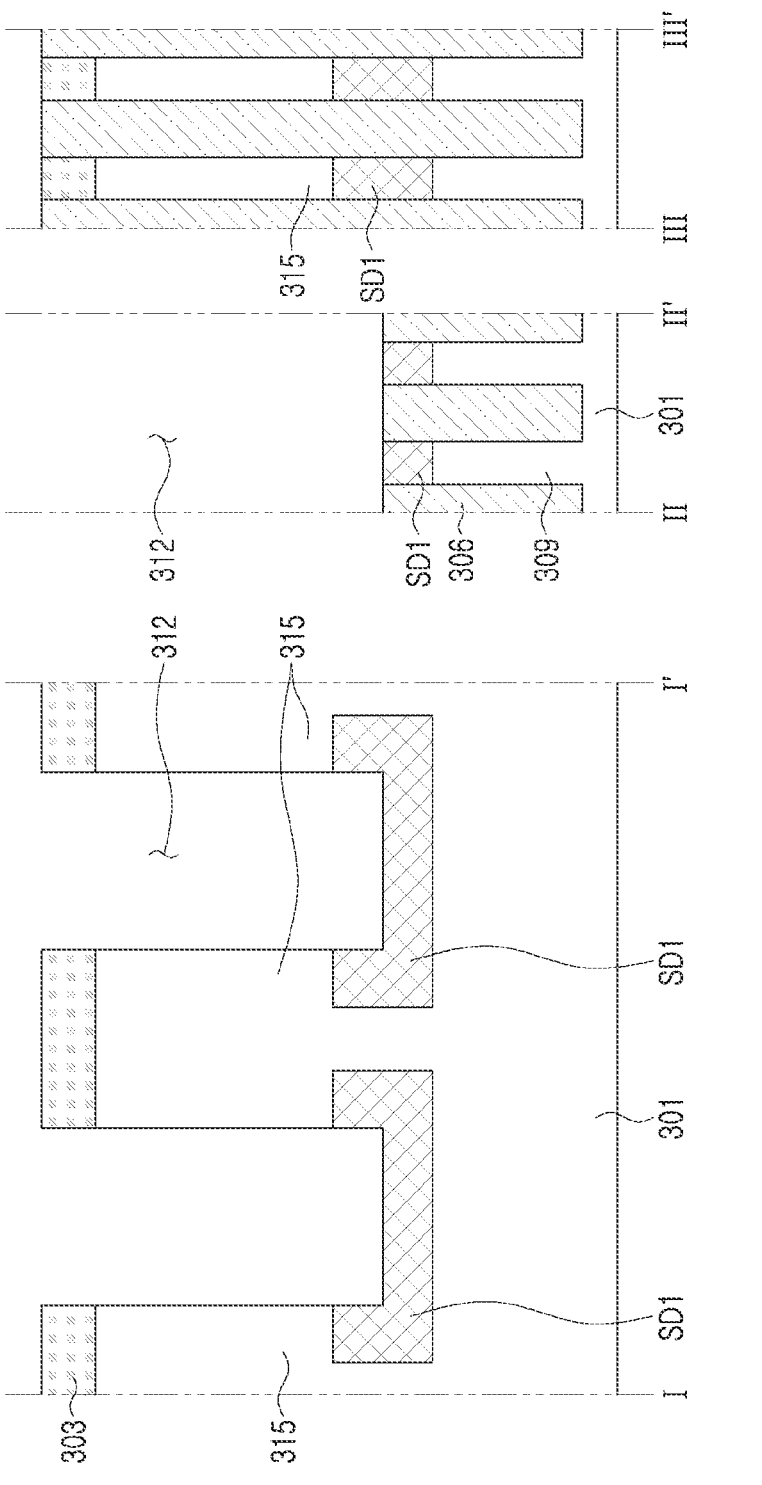

Referring to FIGS. 11 and 14C, lower sources/drains SD1 may be formed in an upper region of the preliminary lower active region 309, adjacent to the bottom surfaces of the trenches 312, and a lower region of the preliminary upper active region 315. The forming the lower sources/drains SD1 may include implanting impurities into an upper region of the preliminary lower active region 309, exposed by the bottom surfaces of the trenches 312, through an ion implantation process and performing an impurity diffusion process to diffuse the impurities to the lower region of the preliminary upper active region 315.

Figure 14D:
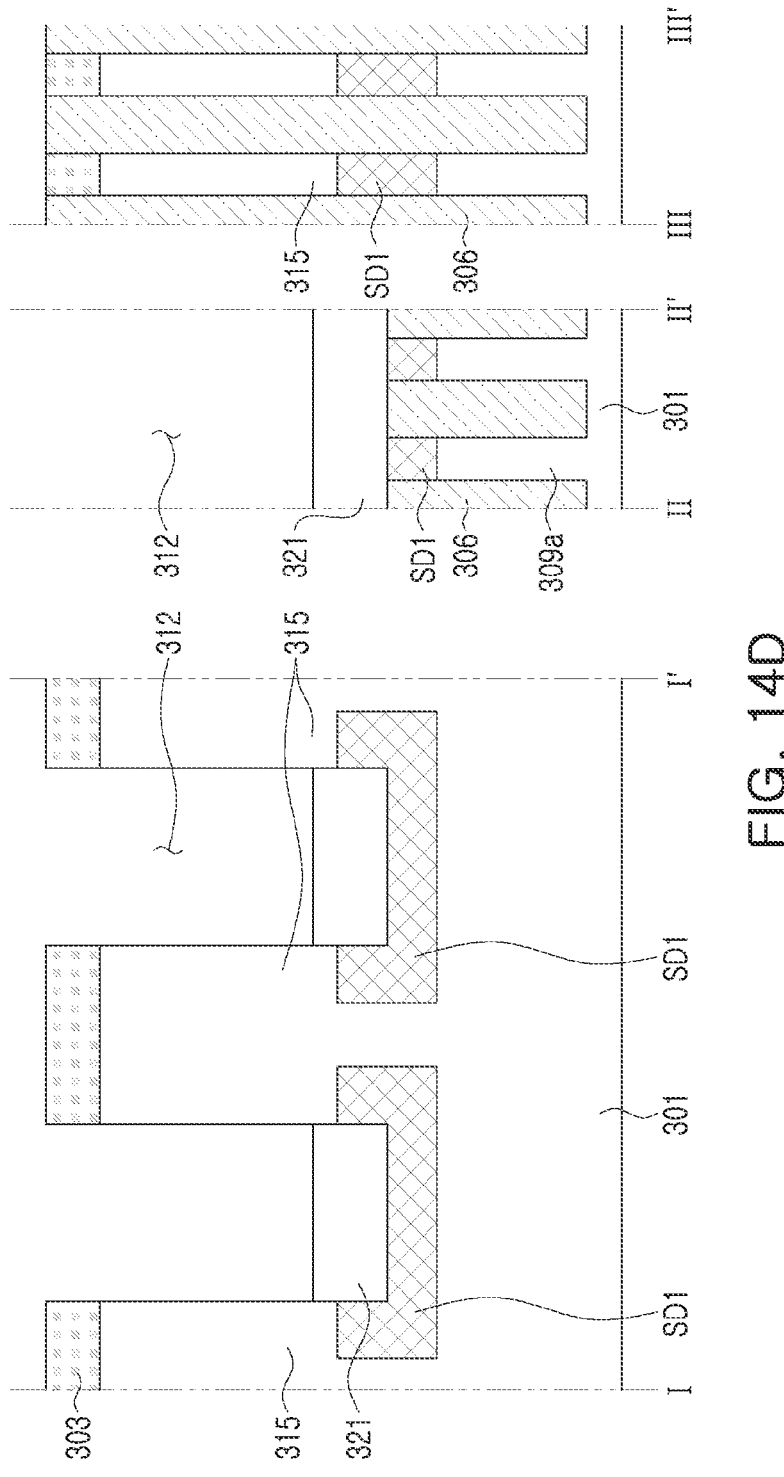

Referring to FIGS. 11 and 14D, an insulating layer 321 may be formed to partially fill the trenches 312. The insulating layer 321 may include at least one of a low dielectric material and a silicon oxide.

Figure 14E:
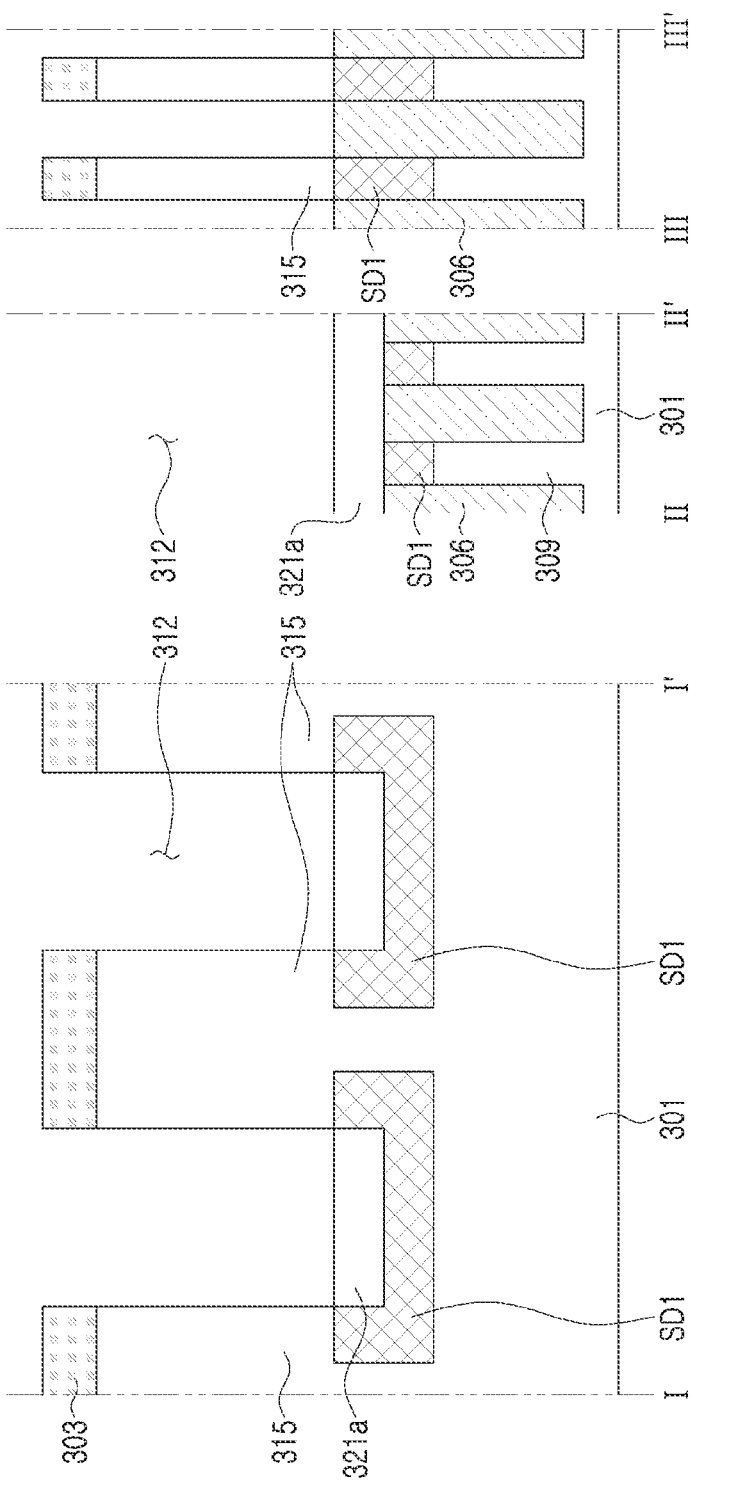

Referring to FIGS. 11 and 14E, when a gate structure having a tri-gate structure is formed as described in FIG. 3A, the first isolation layer 306 covering the insulating layer 321 and a side surface of the preliminary upper active region 315 may be isotropically etched to form an insulating layer 321a having a reduced height and simultaneously to expose a portion of the side surface of the preliminary upper active region 315.

Figure 14F:
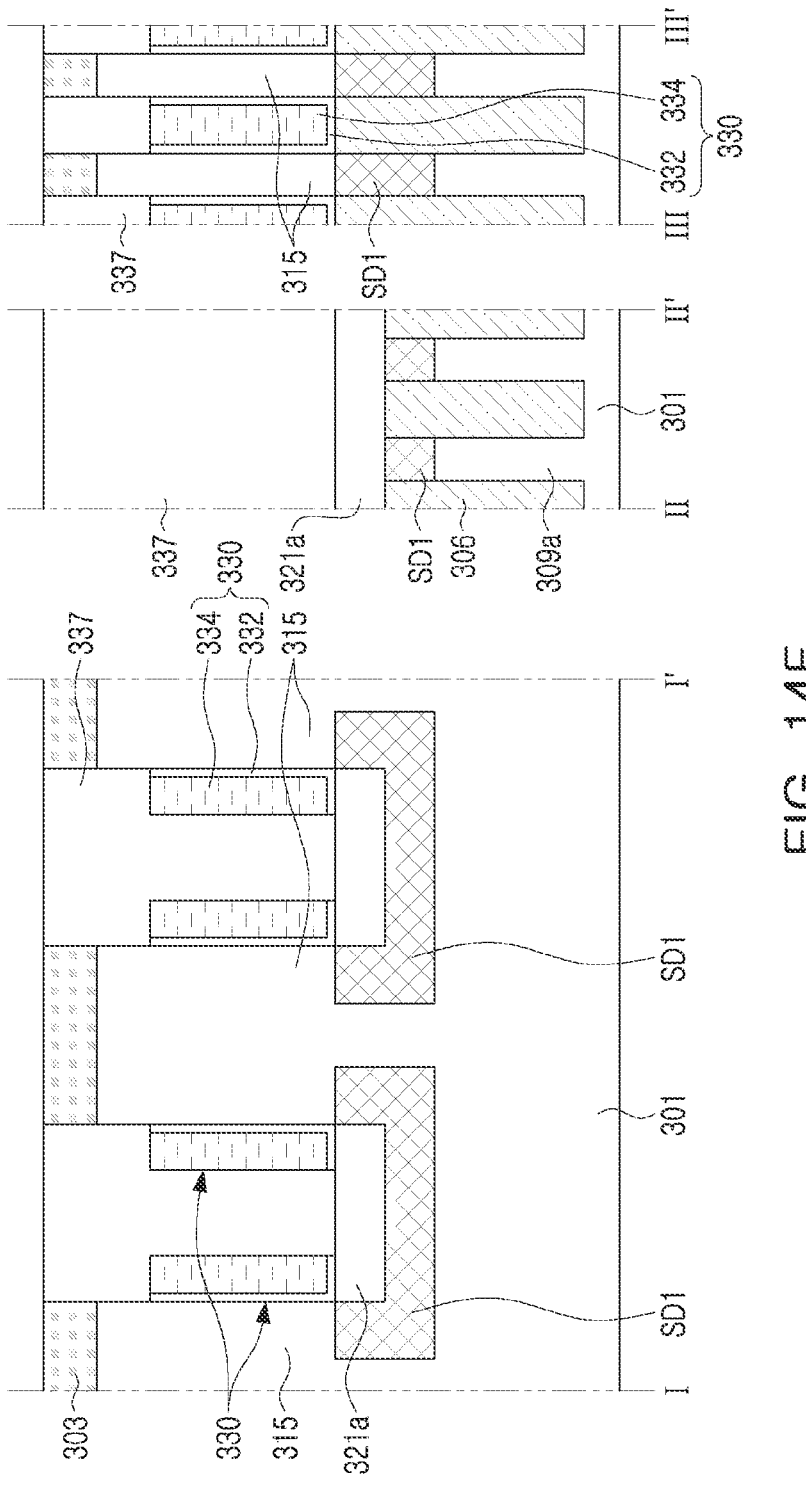

Referring to FIGS. 11 and 14F, gate structures 330, covering opposite sidewalls of the trenches 312, spaced apart from each other, and having upper surfaces disposed on a level lower than a level of an upper surface of the preliminary upper active region 315, may be formed on the insulating layer 321a. Each of the gate structures 330 may include a gate electrode 334 and a gate dielectric layer 332 disposed between the gate electrode 334 and side surfaces of the preliminary upper active region 315 and covering a lower surface of the gate electrode 334. An insulating layer 337 may be formed to cover the gate structures 330 and to fill the trenches 312.

Figure 14G:
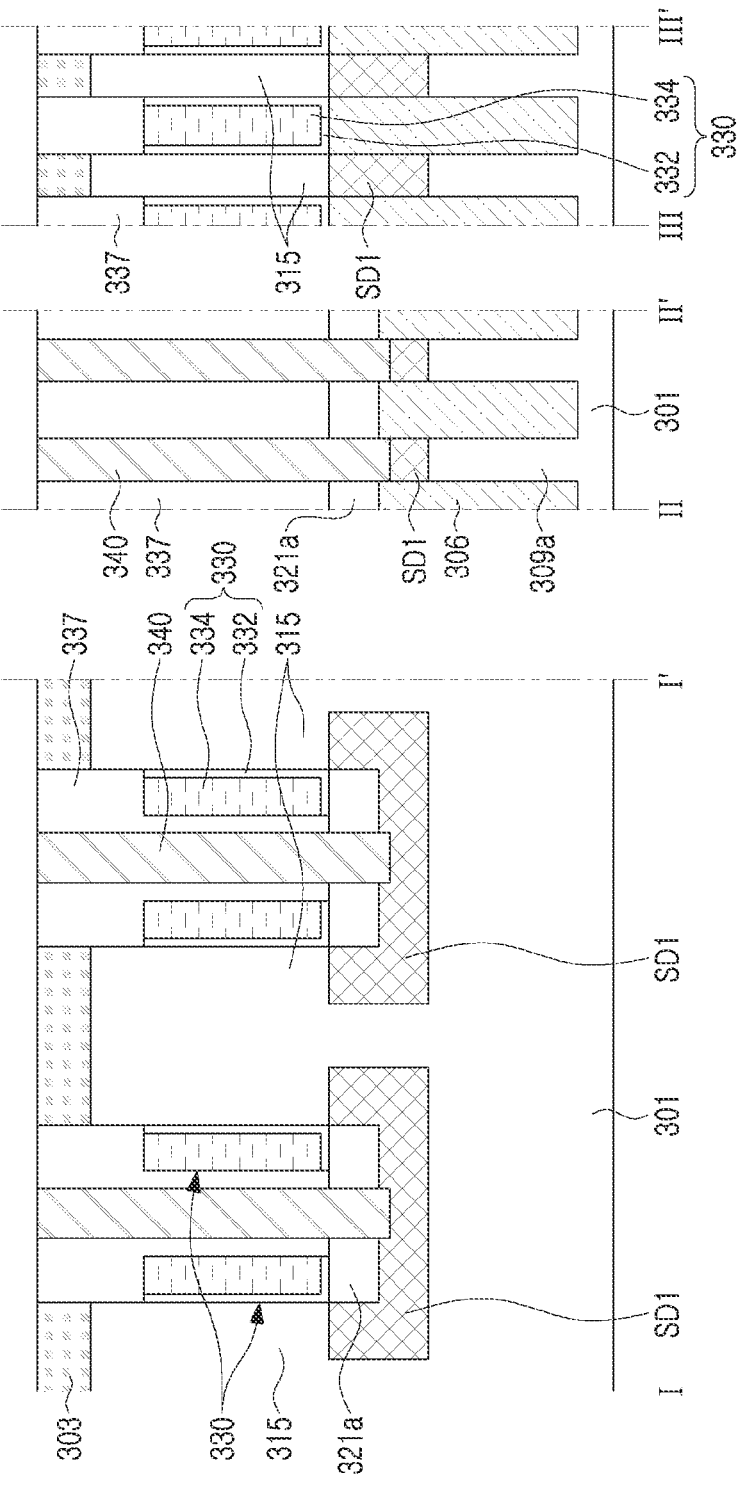

Referring to FIGS. 11 and 14G, contact plugs 340 may be formed to penetrate through the insulating layer 337 and the insulating layer 321a and to contact the lower sources/drains SD1.

Figure 14H:
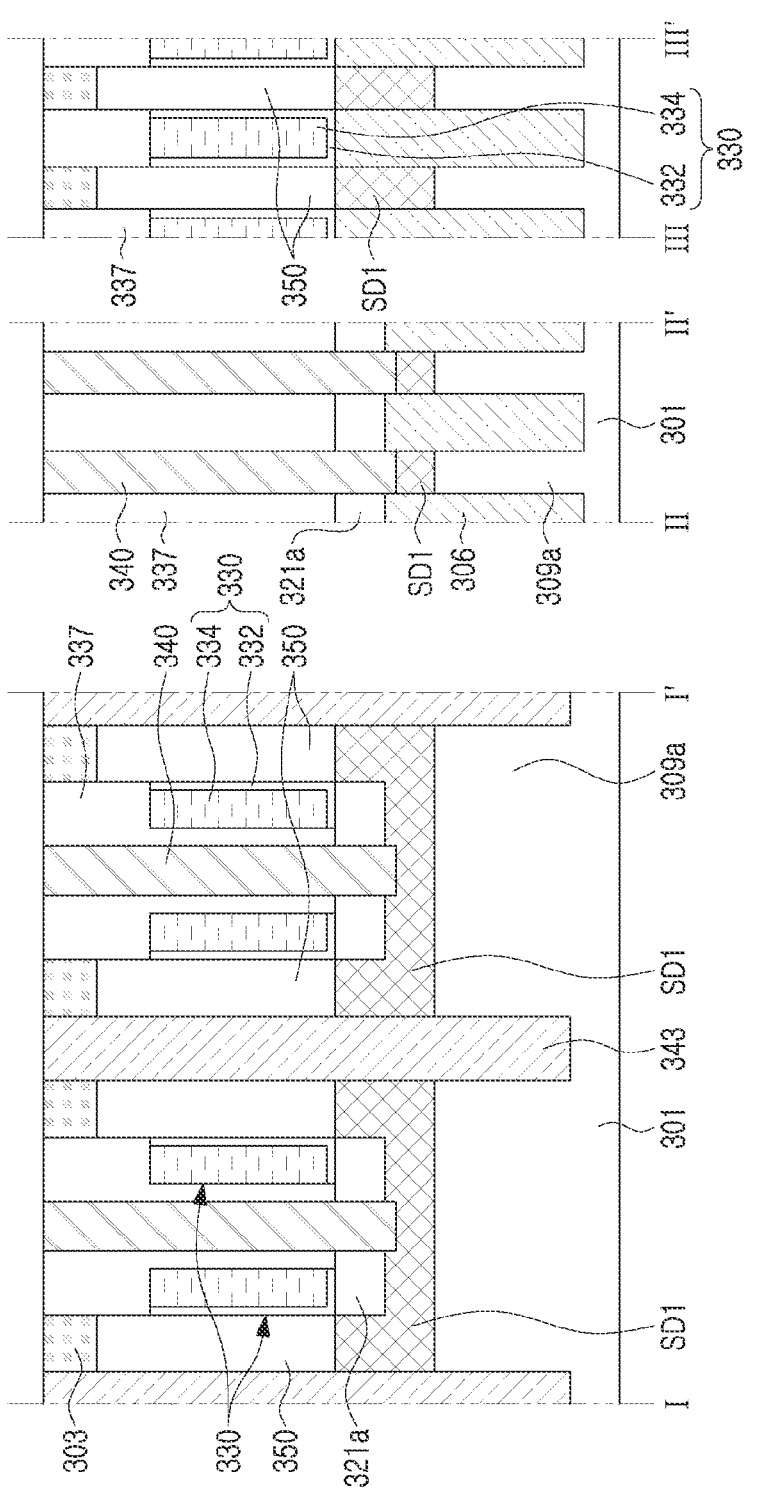

Referring to FIGS. 11 and 14H, a second isolation layer 343 may be formed to penetrate through the mask pattern 303, the preliminary upper active region 315, and a portion of the preliminary lower active region 309. The second isolation layer 343 may be formed to have a line shape. The second isolation layer 343 may be formed of an insulating material.

The preliminary upper active region 315 may be divided into upper active patterns 350 by the second isolation layer 343, and the preliminary lower active region 309 may be divided into active regions 309a. Accordingly, the first and second isolation layers 306 and 343 may be isolation regions defining the active regions 309a.

Figure 14I:
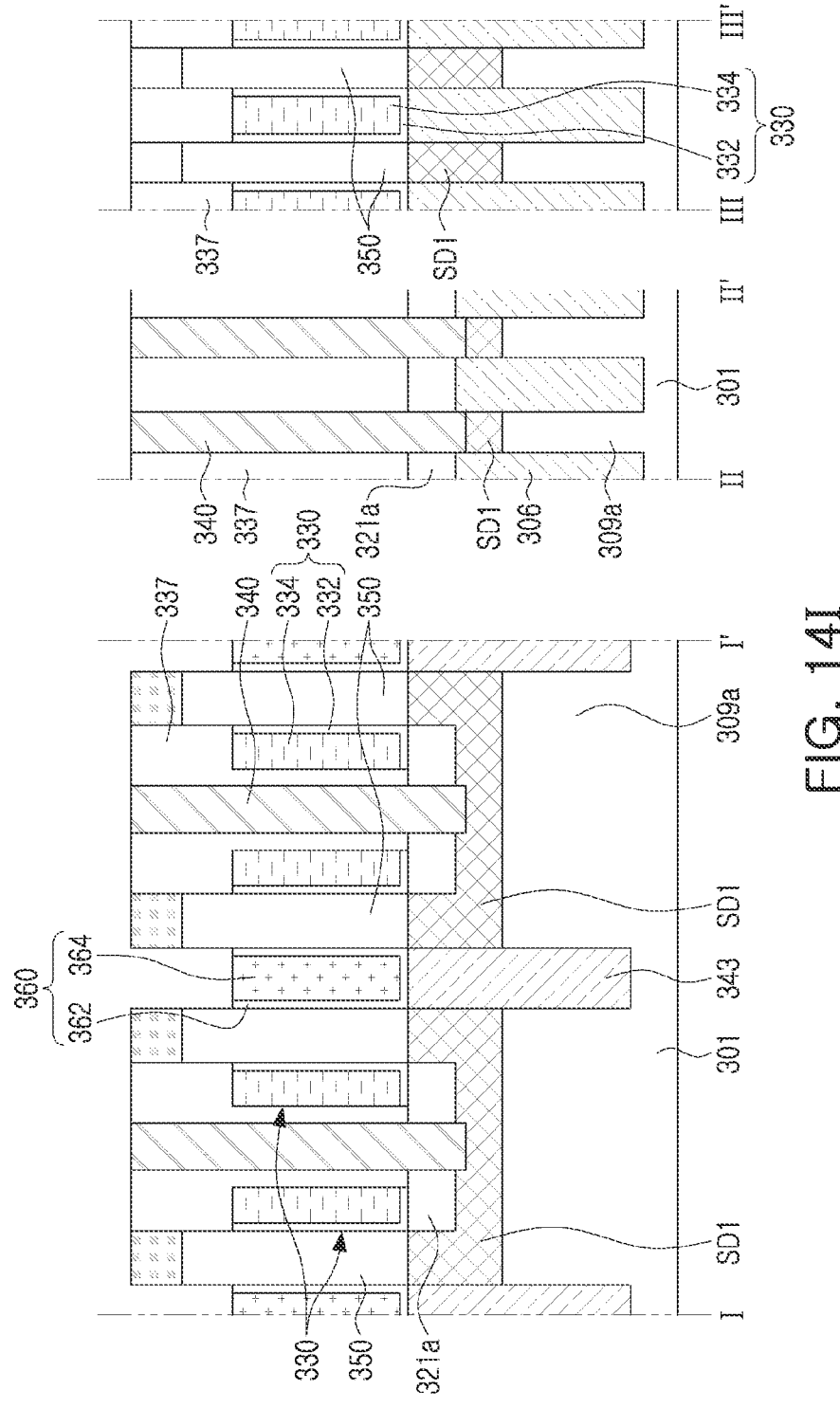

Referring to FIGS. 11 and 14I, a portion of the second isolation layer 343 may be etched such that an opening is formed to expose the upper active patterns 350, and a back gate structure 360 may be formed to fill a portion of the opening. The forming the back gate structure 360 may include forming a back gate dielectric layer 362, forming a back gate electrode 364 on the back gate dielectric layer 362, and etching at least a portion of the back gate electrode 364. An upper surface of the back gate electrode 364 may be formed on a level, lower than a level of upper surfaces of the upper active patterns 350. The back gate dielectric layer 362 may cover side surfaces and a lower surface of the back gate electrode 364.

Figure 14J:
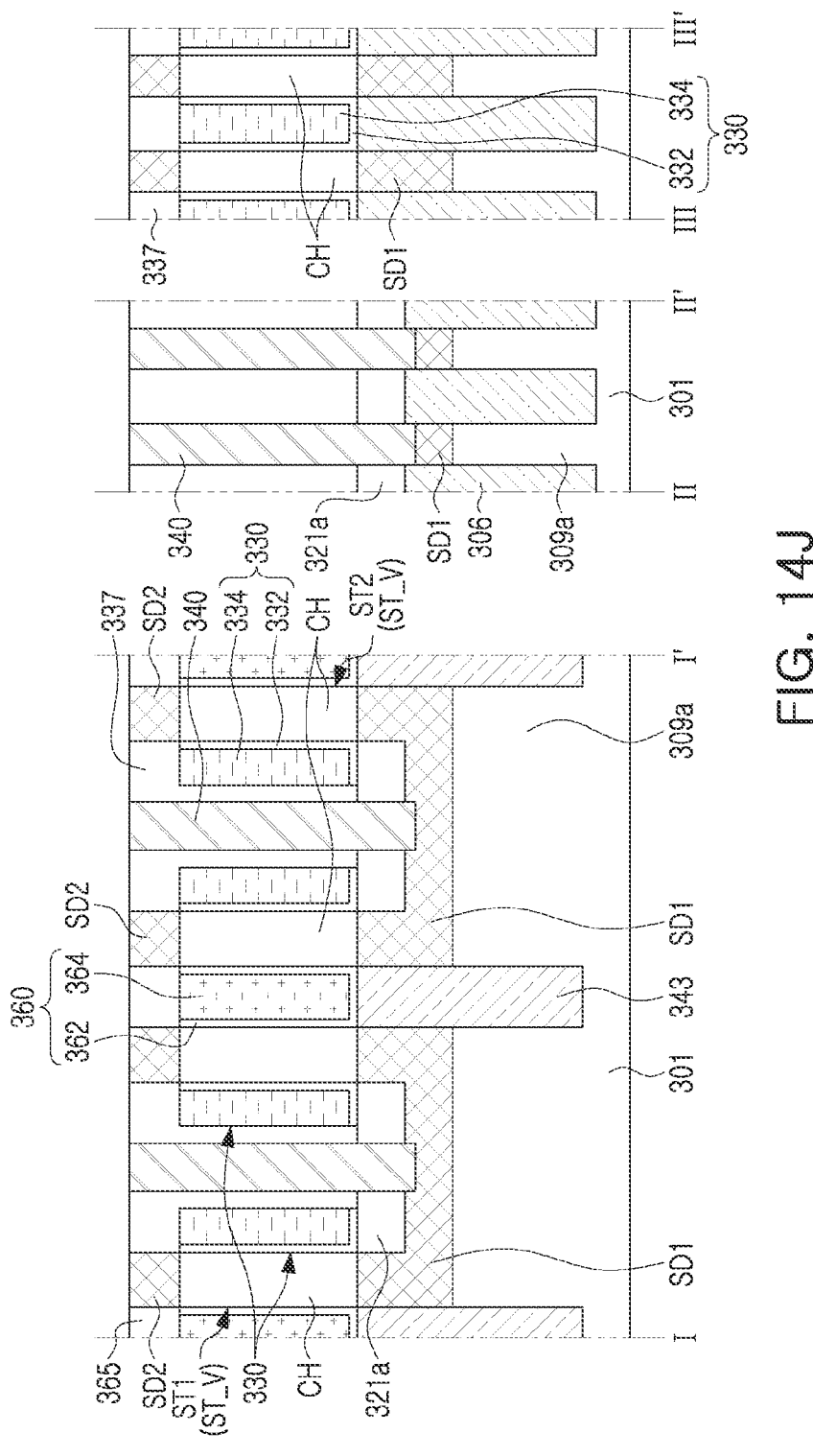

Referring to FIGS. 11 and 14J, an insulating layer 365 may be formed to cover an upper portion of the back gate structure 360. The mask pattern 303 may be removed while forming the insulating layer 365 or after forming the insulating layer 365.

Upper sources/drains SD2 may be formed in upper regions of the upper active patterns 350. In the upper active patterns 350, regions disposed between the lower sources/drains SD1 and the upper source/drains SD1 may be defined as vertical channel regions CH.

Returning to FIGS. 11 and 12, a buffer insulating layer 370 may be formed to cover the upper sources/drains SD2 and the contact plugs 340, holes may be formed to expose the upper sources/drains SD1 through the buffer insulating layer 370, a conductive material layer may be formed to fill the holes and to cover the buffer insulating layer 370, and a bit line capping layer 378 may be formed on the conductive material layer, and the conductive material layer may be etched by an etching process using the bit line capping layer 378 as an etching mask to form conductive lines 381. The conductive lines 381 may be bit lines BL.

Insulating spacers 382 may be formed to cover side surfaces of the bit lines BL and the bit line capping layer 378. An insulating layer 384 may be formed between the bit lines BL. Contact plugs 392 may be formed to penetrate through the insulating layer 384 and to be electrically connected to the upper sources/drains SD2. Conductive pads 394 may be formed on the contact plugs 392 to be electrically connected to the contact plugs 392. An insulating layer 396 may be formed between the conductive pads 394.

A data storage structure DS may be formed on the conductive pads 394. The data storage structure DS may be a data storage structure of a DRAM, for example, memory cell capacitors, storing data, in the DRAM, but example embodiments are not limited thereto. For example, the data storage structure DS may be a data storage structure of an MRAM or a data storage structure of an FeRAM.

Figure 15A:
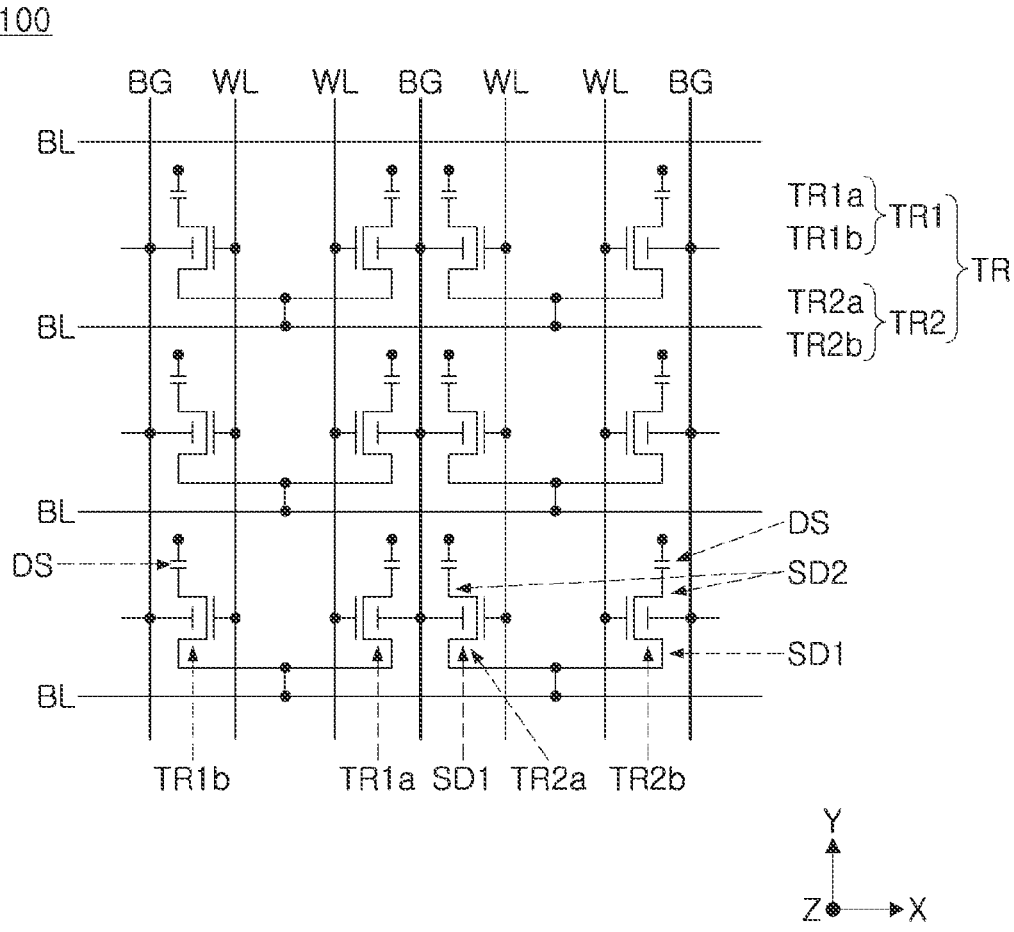
FIG. 15A is a conceptual circuit diagram illustrating a modified example of a semiconductor device according to an example embodiment.

Next, a circuit of a semiconductor device according to an example embodiment will be described with reference to FIG. 15A. FIG. 15A is a conceptual circuit diagram illustrating an example of a semiconductor device according to an example embodiment, and may illustrate the semiconductor device 100 of FIG. 9 in a circuital manner.

Referring to FIG. 15A, the semiconductor device 100 may include transistors TR, word lines WL, back gate lines BG, bit lines BL, and data storage structures DS.

The word lines WL and the back gate lines BG may be parallel or substantially parallel to each other, and may be spaced apart from each other. A pair of word lines WL may be disposed between a pair of the back gate lines BG adjacent to each other. A single back gate line BG may be disposed between two adjacent word lines WL.

The transistors TR may include a first pair of transistors TR1, disposed on a left side with respect to the single back gate line BG, and a second pair of transistors TR2 disposed on a right side with respect to the single back gate line BG.

The first pair of transistors TR1 may include a first transistor TR1$a$ and a second transistor TR1$b$ sharing a single lower source/drain SD1. The first and second transistors TR1$a$ and TR1$b$ may include upper sources/drains SD2 spaced apart from each other.

The second pair of transistors TR2 may include a third transistor TR2$a$ and a fourth transistor TR2$b$ sharing a single lower source/drain SD1. The third and fourth transistors TR2$a$ and TR2$b$ may include upper sources/drains SD2 spaced apart from each other. The lower sources/drains SD1 may be the first and third sources/drains 20$sd$1 and 20$sd$3 of FIG. 9, and the upper source/drains SD2 may be the second and fourth sources/drains 20$sd$2 and 20$sd$4 of FIG. 9.

FIG. 9 may be a perspective view illustrating the first transistor TR1$a$, among the first pair of transistors TR1, and the third transistor TR2$a$, among the second pair of transistors TR2. The first transistor TR1$a$ and the third transistor TR2$a$ may be adjacent to each other with the single back gate line BG interposed therebetween.

In the first pair of transistors TR1, the first and second transistors TR1$a$ and TR1$b$ have a structure, mirror-symmetrical with respect to a central portion of a single shared lower source/drain SD1.

In the second pair of transistors TR2, the third and fourth transistors TR2$a$ and TR2$b$ have a structure, mirror-symmetrical with respect to a central portion of a single shared lower source/drain SD1.

As illustrated in FIG. 9, the bit lines BL may be disposed below the first and third source/drains 20$sd$1 and 20$sd$3, for example, the lower sources/drains SD1.

The bit lines BL may have a line shape extending in the first direction X, and the word lines WL and the back gate lines BG may have a line shape extending in a second direction Y, perpendicular to the first direction X. The transistors TR may be arranged in the first direction X and the second direction Y.

The data storage structure DS may be a data storage structure of a DRAM, for example, cell capacitors of a DRAM. However, example embodiments are not limited thereto, and the data storage structure DS may be a data storage structure of another memory, for example, an MRAM or an FeRAM.

Figure 15B:
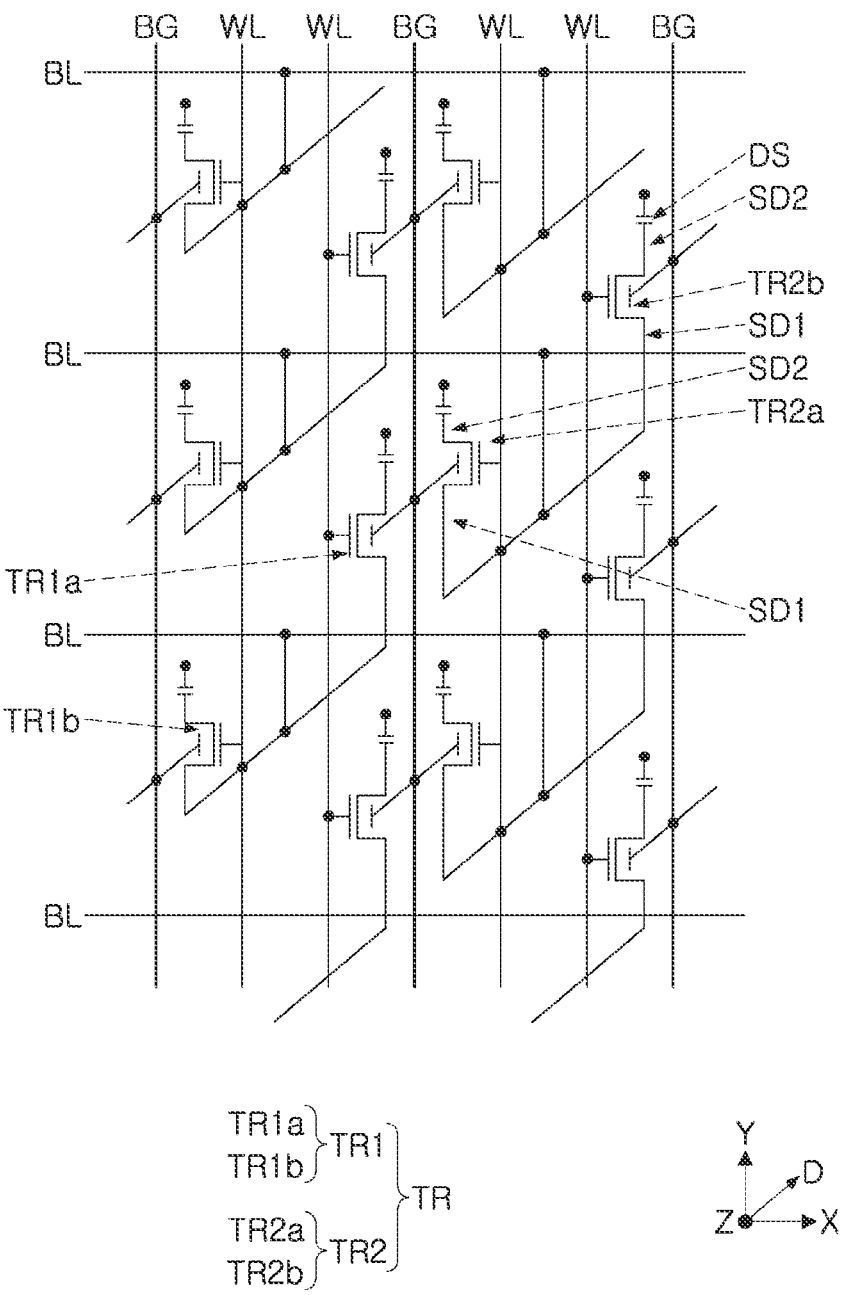
FIG. 15B is a conceptual circuit diagram illustrating a modified example of a semiconductor device according to an example embodiment.

Next, a circuit of a semiconductor device according to an example embodiment will be described with reference to FIG. 15B. FIG. 15B is a conceptual circuit diagram illustrating an example of a semiconductor device according to an example embodiment, and may illustrate the semiconductor device 200 of FIG. 10 and the semiconductor device 300 of FIGS. 11 and 12 in a circuital manner.

Referring to FIG. 15B, the semiconductor device 200 may include transistors TR, word lines WL, back gate lines BG, bit lines BL, and a data storage structure DS. The word lines WL and the back gate lines BG may be parallel or substantially parallel to each other, and may be spaced apart from each other. A pair of word lines WL may be disposed between a pair of the back gate lines BG adjacent to each other. A single back gate line BG may be disposed between two adjacent word lines WL.

The transistors TR may include a first pair of transistors TR1, disposed on a left side with respect to the single back gate line BG, and a second pair of transistors TR2 disposed on a right side with respect to the single back gate line BG.

The first pair of transistors TR1 may include a first transistor TR1$a$ and a second transistor TR1$b$ sharing a single lower source/drain SD1. The first and second transistors TR1$a$ and TR1$b$ may include upper sources/drains SD2 spaced apart from each other. The second pair of transistors TR2 may include a third transistor TR2$a$ and a fourth transistor TR2$b$ sharing a single lower source/drain SD1. The third and fourth transistors TR2$a$ and TR2$b$ may include upper sources/drains SD2 spaced apart from each other.

The lower source/drains SD1 may be the first and third sources/drains 20$sd$1 and 20$sd$3 as illustrated in FIG. 10 or the lower sources/drains SD1 as illustrated in FIG. 12, and the upper sources/drains SD2 may be the second and fourth sources/drains 20$sd$2 and 20$sd$4 as illustrated in FIG. 9 or the upper sources/drains SD2 as illustrated in FIG. 12.

FIG. 10 may be a perspective view illustrating the first transistor TR1$a$, among the first pair of transistors TR1, and the third transistor TR2$a$, among the second pair of transistors TR2. The first transistor TR1$a$ and the third transistor TR2$a$ may be adjacent to each other with the single back gate line BG interposed therebetween.

The bit lines BL may have a line shape extending in a first direction X, and the word lines WL and the back gate lines BG may have a line shape extending in a second direction Y, perpendicular or substantially perpendicular to the first direction X. The bit lines BL may be disposed on the second and fourth sources/drains 20$sd$2 and 20$sd$4, for example, the upper sources/drains SD2 as illustrated in FIGS. 10 and 12.

In the first pair of transistors TR1, the first and second transistors TR1$a$ and TR1$b$ may have a mirror-symmetrical structure in an inclination direction D with respect to a center portion of the shared single lower source/drain SD1. The inclination direction D may be a length direction of the horizontal parts 20H1 and 20H2 in FIG. 10 and a length direction of the horizontal parts ST_H in FIGS. 11 and 12. The inclination direction D may be a direction inclined with respect to each of the first direction X and the second direction Y. The inclination direction D may be a direction other than 90 degrees with respect to the first direction X and the second direction Y.

The data storage structure DS may be a data storage structure of a DRAM, for example, cell capacitors of the DRAM. However, example embodiments are not limited thereto, and the data storage structure DS may be a data storage structure of another memory, for example, an MRAM or an FeRAM.

A negative voltage, 0V, or a positive voltage may be applied depending on operating conditions or desired optimized performance of the above-described semiconductor devices 1, 100, 200, and 300. For example, when a first positive voltage is applied to the word lines WL, a positive voltage lower than the first positive voltage may be applied to the back gate lines BG.

Figure 16:
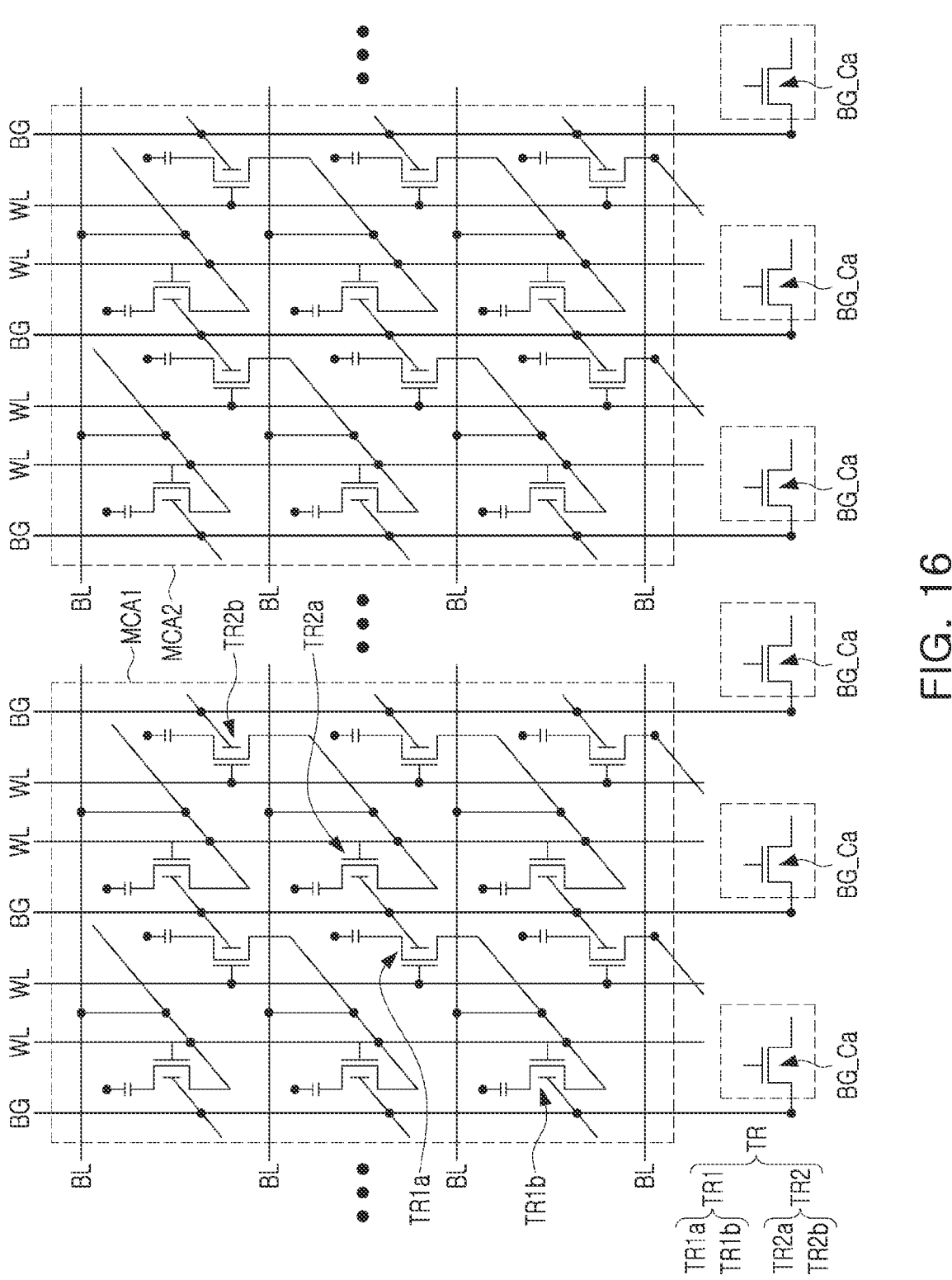
FIG. 16 is a conceptual circuit diagram illustrating a modified example of a semiconductor device according to an example embodiment.

In the above-described semiconductor devices 1, 100, 200, and 300, the back gate lines BG described above with reference to FIGS. 1 to 15B may be individually controlled or a plurality of back gate lines BG may be simultaneously or substantially simultaneously controlled. Hereinafter, example embodiments of controlling the back gate lines BG will be described with reference to FIGS. 16, 17, and 18, respectively. FIG. 16 is a conceptual circuit diagram illustrating that the back gate lines BG are individually controlled, FIG. 17 is a conceptual circuit diagram illustrating that the back gate lines BG are controlled in a plurality of units, and FIG. 18 is a conceptual circuit diagram illustrating that all of the back gate lines BG are simultaneously or substantially simultaneously controlled.

Figure 17:
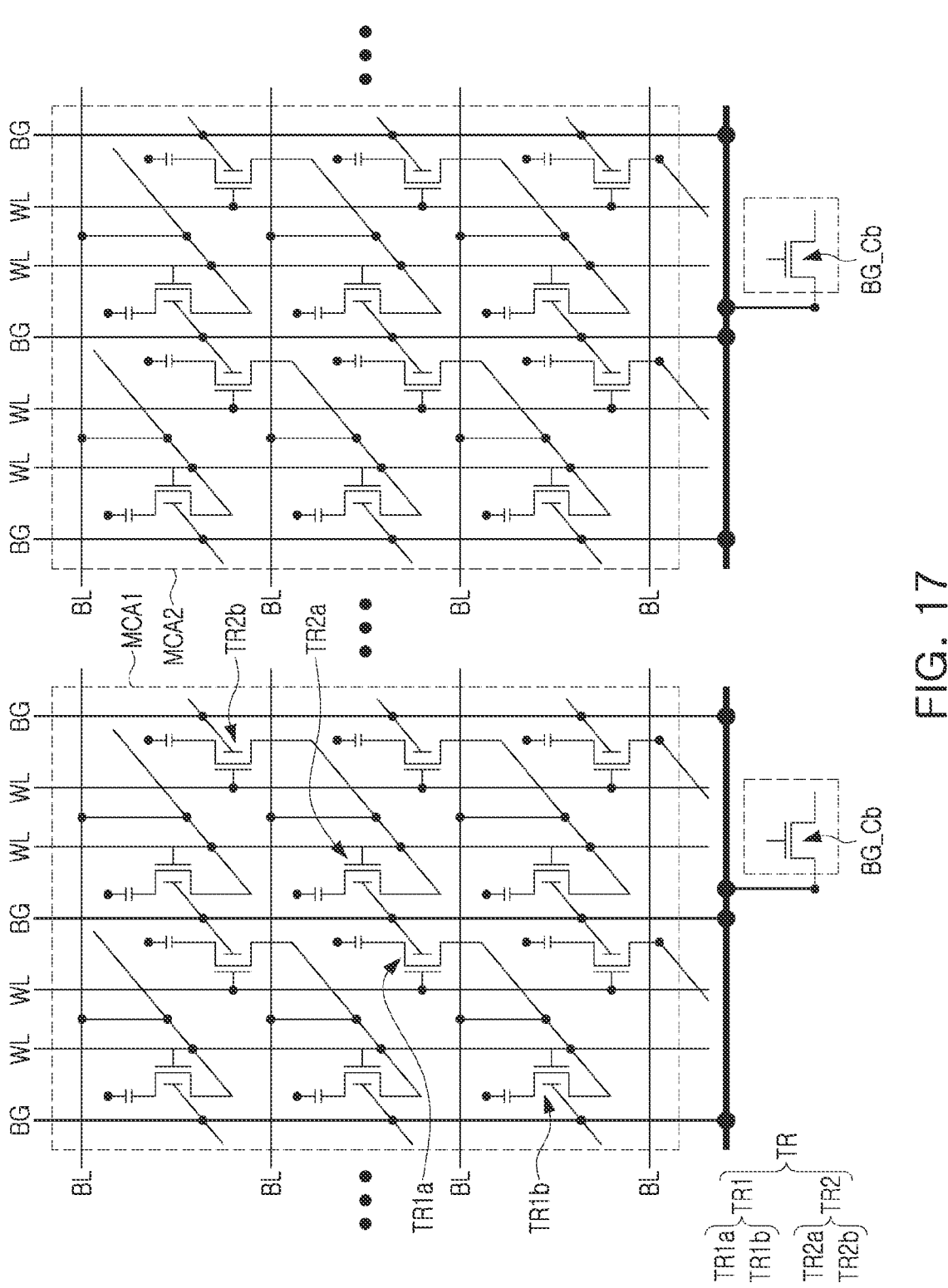
FIG. 17 is a conceptual circuit diagram illustrating a modified example of a semiconductor device according to an example embodiment.
Figure 18:
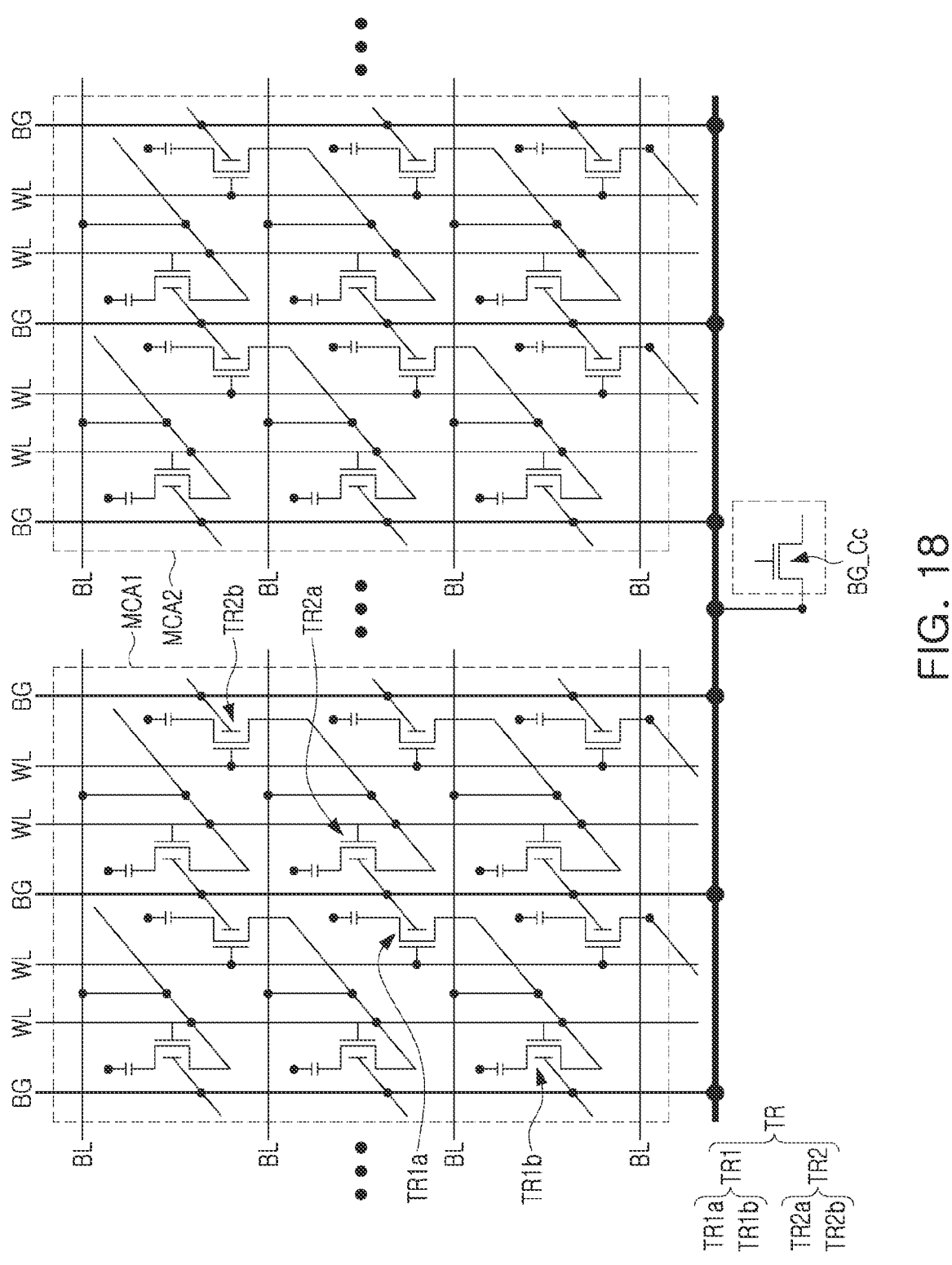
FIG. 18 is a conceptual circuit diagram illustrating a modified example of a semiconductor device according to an example embodiment.

Referring to FIGS. 16, 17, and 18, the above-described semiconductor devices 1, 100, 200, and 300 may be spaced apart from each other and may include a plurality of independent memory cell arrays MCA1 and MCA2. When the above-described semiconductor devices 1, 100, 200, and 300 are DRAMs, the plurality of memory cell arrays MCA1 and MCA2 may constitute a bank. In the above-described semiconductor devices 1, 100, 200, and 300, a plurality of banks may be disposed.

Each of the plurality of memory cell arrays MCA1 and MCA2 may include the transistors TR, the word lines WL, the back gate lines BG, the bit lines BL, and a data storage structure DS described with reference to FIGS. 15A and 15B. A circuit of each of the plurality of memory cell arrays MCA1 and MCA2 may be the same as the circuit of FIG. 15A, or the same as the circuit of FIG. 15B.

A back gate control circuit (e.g., BG_Ca of FIG. 16, BG_Cb of FIG. 17, or BG_Cc of FIG. 18) for controlling and/or driving the back gate lines BG may be disposed on at least one side of the plurality of memory cell arrays MCA1 and MCA2.

In one example embodiment, referring to FIG. 16, the back gate control circuit (BG_Ca of FIG. 16) may individually control or operate the back gate lines BG. For example, the same voltage may be applied to all of the back gate lines BG, or a voltage different from that of other back gate lines may be applied to some of the back gate lines BG. For example, in a single memory cell array MCA, a voltage different from that of other back gate lines may be applied to some of the back gate lines BG.

In another example embodiment, referring to FIG. 17, the back gate control circuit BG_Cb may simultaneously or substantially simultaneously control and drive a plurality of the back gate lines BG. For example, the back gate control circuit BG_Cb may control or drive the back gate lines BG in units of each of the plurality of memory cell arrays MCA1 and MCA2 or in units of banks. For example, the back gate control circuit (e.g., BG_Cb of FIG. 17) may apply a first voltage to the back gate lines BG in the first memory cell array MCA1, among the plurality of memory cell arrays MCA1 and MCA2, and may apply a second voltage, different from the first voltage, to the back gate lines BG of the second memory cell array MCA2 independent of the first memory cell array MCA1. Alternatively, the back gate control circuit (e.g., BG_Cb of FIG. 17) may apply a first voltage to the back gate lines BG of the plurality of memory cell arrays MCA1 included in the first bank, among the plurality of banks, and may apply a second voltage, different from the first voltage, to the back gate lines BG of the plurality of memory cell arrays MCA2 included in a second bank, among the plurality of banks.

In another example embodiment, referring to FIG. 18, the back gate control circuit BG_Cc may simultaneously or substantially simultaneously control or operate the back gate lines BG of a single memory chip. For example, the back gate control circuit BG_Cc may apply the same voltage to the back gate lines BG of the entire memory chip.

As described above, example embodiments may provide a semiconductor device including vertical channel regions, which may be a floating body, and a single back gate line disposed between the vertical channel regions. Since the back gate line may suppress or prevent a floating body effect, electrical characteristics of a semiconductor device may be improved. The back gate line may significantly reduce or prevent fluctuation of a threshold voltage of transistors including the vertical channel regions. Accordingly, the back gate line allow the transistors to stably operate. As a result, a semiconductor device in which a single back gate line is disposed between the vertical channel regions to improve electrical characteristics and to increase the degree of integration may be provided.

According to some example embodiments, a gate electrode covering at least three side surface of each of the vertical channel regions, for example, a gate electrode having a tri-gate structure may be disposed. Since such a semiconductor device may include transistors which may be a FinFET having a tri-gate structure as well as a vertical channel structure and may include the back gate line, performance thereof may be improved.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments have been shown and described above, it will be apparent to those skilled in the art that modifications and variations could be made without departing from the scope of the inventive concepts.

What is claimed is:

1. A semiconductor device comprising:
   a substrate;
   a first gate structure and a second gate structure on the substrate, the first gate structure and the second gate structure spaced apart from each other in a first direction;
   a single back gate structure between the first gate structure and the second gate structure, wherein the single back gate structure includes a back gate dielectric layer and a back gate electrode, and wherein the back gate electrode of the single back gate structure is spaced apart from the first gate structure and the second gate structure;

a first structure including a first vertical channel region extending in a vertical direction, wherein at least a portion of the first vertical channel region is between the first gate structure and the single back gate structure; and a second structure including a second vertical channel region extending in the vertical direction, the second structure spaced apart from the first structure, wherein at least a portion of the second vertical channel region is between the second gate structure and the single back gate structure, wherein the first gate structure includes a first gate electrode and a first gate dielectric layer, the first gate dielectric layer between the first gate electrode and the first structure, wherein the second gate structure includes a second gate electrode and a second gate dielectric layer, the second gate dielectric layer between the second gate electrode and the second structure, and wherein the back gate dielectric layer includes a first back gate dielectric portion between the back gate electrode and the first structure, and a second back gate dielectric portion between the back gate electrode and the second structure.

2. The semiconductor device of claim 1, wherein the first structure further includes a first source/drain below the first vertical channel region and a second source/drain above the first vertical channel region, and the second structure further includes a third source/drain below the second vertical channel region and a fourth source/drain above the second vertical channel region.

3. The semiconductor device of claim 1, wherein the first vertical channel region includes a first side surface and a second side surface opposing each other in the first direction, and a third side surface and a fourth side surface opposing each other in a second direction, the second direction intersecting the first direction, the second vertical channel region includes a fifth side surface and a sixth side surface opposing each other in the first direction, and a seventh side surface and an eighth side surface opposing each other in the second direction, the first gate structure covers at least a portion of each of the third and fourth side surfaces and the first side surface, the second gate structure covers at least a portion of each of the seventh and eighth side surfaces and the fifth side surface, and the single back gate structure covers the second side surface and the sixth side surface.

4. The semiconductor device of claim 3, wherein the first gate structure has a first width in a portion covering the first side surface, and the single back gate structure has a second width in a portion covering the second side surface, the second width different than the first width.

5. The semiconductor device of claim 3, wherein the first gate structure covers a first portion of each of the third and fourth side surfaces, the second gate structure covers a second portion of each of the seventh and eighth side surfaces, and the single back gate structure covers a third portion of each of the third and fourth side surfaces and a fourth portion of each of the seventh and eighth side surfaces.

6. The semiconductor device of claim 5, wherein in each of the third and fourth side surfaces, the first portion is greater than the third portion, and in each of the seventh and eighth side surfaces, the second portion is greater than the fourth portion.

7. The semiconductor device of claim 1, wherein the first gate electrode has a first vertical thickness, and the back gate electrode has a second vertical thickness, the second vertical thickness different than the first vertical thickness.

8. The semiconductor device of claim 1, wherein the first structure includes a first horizontal portion and a first vertical portion extending from a portion of the first horizontal portion in the vertical direction, and the first vertical portion includes the first vertical channel region, the second structure includes a second horizontal portion and a second vertical portion extending from a portion of the second horizontal portion in the vertical direction, and the second vertical portion includes the second vertical channel region, at least a portion of the first gate structure is on the first horizontal portion, and at least a portion of the second gate structure is on the second horizontal portion.

9. The semiconductor device of claim 8, further comprising:

a first contact plug on the first vertical portion;

a second contact plug on the first horizontal portion;

a data storage structure on the first contact plug; and a bit line on the second contact plug, wherein the first gate structure includes a region between the second contact plug and the first vertical portion, and at least a portion of the bit line is on a level higher than a level of the first vertical portion.

10. The semiconductor device of claim 8, further comprising:

a contact plug on the first vertical portion;

a data storage structure on the contact plug; and a bit line below the first horizontal portion.

11. A semiconductor device comprising:

a substrate;

a first structure on the substrate, the first structure including a first horizontal portion and a pair of first vertical portions extending from the first horizontal portion in a vertical direction, wherein the pair of first vertical portions are spaced apart from each other;

a second structure on the substrate, the second structure including a second horizontal portion and a pair of second vertical portions extending from the second horizontal portion in the vertical direction, wherein the pair of second vertical portions are spaced apart from each other;

a pair of first gate structures on the first horizontal portion between the pair of first vertical portions, the pair of first gate structures extending in a horizontal direction;

a pair of second gate structures on the second horizontal portion, between the pair of second vertical portions, the pair of second gate structures extending in the horizontal direction; and a single back gate structure between the first structure and the second structure.

12. The semiconductor device of claim 11, wherein
a first gate structure of the pair of first gate structures is in contact with a first vertical portion of the pair of first vertical portions,
the first vertical portion includes a first vertical channel region,
the first vertical channel region includes a first side surface and a second side surface opposing each other, and a third side surface and a fourth side surface opposing each other,
the first gate structure covers at least a portion of each of the third and fourth side surfaces and the first side surface, and
the single back gate structure covers at least the second side surface.

13. The semiconductor device of claim 12, wherein
in the first vertical channel region, a corner between the first side surface and the third side surface is round, and a corner between the first side surface and the fourth side surface is round.

14. The semiconductor device of claim 11, further comprising:
an isolation region defining a first active region and a second active region on the substrate,
wherein
the first structure is on the first active region, and
the second structure is on the second active region.

15. The semiconductor device of claim 11, further comprising:
multiple contact structures on the pair of first vertical portions;
a contact plug on the first horizontal portion, the contact plug electrically connected to the first horizontal portion;
a data storage structure on the contact structures, the data storage structure electrically connected to the contact structures; and
a bit line on the contact plug, the bit line electrically connected to the contact plug,
wherein
the contact plug is between the pair of first gate structures.

16. A semiconductor device comprising:
a first memory cell array;
a second memory cell array spaced apart from the first memory cell array; and
a back gate control circuit on at least one side of each of the first and second memory cell arrays, each of the first and second memory cell arrays includes transistors, word lines, bit lines, data storage structures, and back gate lines,
the back gate lines intersect the first and second memory cell arrays, and the back gate lines are electrically connected to the back gate control circuit,
the bit lines extend in a first direction,
the word lines and the back gate lines are parallel to each other and spaced apart from each other, and the word lines and the back gate lines extend in a second direction perpendicular to the first direction,
the transistors include a first pair of transistors sharing a single first lower source/drain, and a second pair of transistors sharing a single second lower source/drain,
a single first back gate line of the back gate lines is between the first pair of transistors and the second pair of transistors, and
each of the first pair of transistors further includes a vertical channel region on the single first lower source/drain and an upper source/drain on the vertical channel region.

17. The semiconductor device of claim 16, wherein
the word lines comprise gate electrodes of the first pair of transistors, and
a first gate electrode of the gate electrodes covers at least three side surfaces of the vertical channel region.

18. The semiconductor device of claim 17, wherein
the single first back gate line covers at least three side surfaces of the vertical channel region, and
the vertical channel region is between the single first back gate line and the first gate electrode.

19. The semiconductor device of claim 16, wherein
the back gate control circuit is configured to simultaneously control a plurality of the back gate lines.

20. The semiconductor device of claim 1, wherein the first gate electrode includes:
a first electrode portion facing the first vertical channel region in the first direction; and
a second electrode portion not facing the first vertical channel region in the first direction,
wherein a distance between the first electrode portion and the back gate electrode in the first direction is greater than a distance between the second electrode portion and the back gate electrode in the first direction.

\* \* \* \* \*